United States Patent
Christen et al.

(10) Patent No.: US 9,768,798 B2
(45) Date of Patent: Sep. 19, 2017

(54) DELTA-SIGMA MODULATOR AND METHOD FOR SIGNAL CONVERSION

(71) Applicant: ams AG, Unterpremstaetten (AT)

(72) Inventors: Thomas Christen, Zurich (CH);
Thomas Froehlich, Ottikon (CH);
Andreas Fitzi, Staefa (CH); Dusan Prelog, Radenci (SI)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/121,753

(22) PCT Filed: Feb. 13, 2015

(86) PCT No.: PCT/EP2015/053088
§ 371 (c)(1),
(2) Date: Aug. 25, 2016

(87) PCT Pub. No.: WO2015/128208
PCT Pub. Date: Sep. 3, 2015

(65) Prior Publication Data
US 2017/0077946 A1    Mar. 16, 2017

(30) Foreign Application Priority Data
Feb. 25, 2014   (EP) .................................. 14156565

(51) Int. Cl.
*H03M 3/00*   (2006.01)

(52) U.S. Cl.
CPC .......... *H03M 3/422* (2013.01); *H03M 3/328* (2013.01); *H03M 3/334* (2013.01); *H03M 3/436* (2013.01); *H03M 3/464* (2013.01); H03M 3/424 (2013.01); H03M 3/43 (2013.01); H03M 3/438 (2013.01)

(58) Field of Classification Search
CPC ........ H03M 3/422; H03M 3/00; H03M 3/344; H03M 3/458; H03M 3/332; H03M 3/424; H03M 3/454
USPC .................................................. 341/143–155
See application file for complete search history.

(56) References Cited

U.S. PATENT DOCUMENTS

| | | | | |
|---|---|---|---|---|
| 5,144,308 A * | 9/1992 | Norsworthy | ......... | H04B 14/046 341/131 |
| 6,175,321 B1 * | 1/2001 | Frannhagen | ........ | H03M 7/3008 341/131 |
| 6,201,835 B1 * | 3/2001 | Wang | ...................... | H03M 3/34 341/143 |
| 6,975,255 B1 * | 12/2005 | Zhang | ................... | H03M 3/332 341/131 |

(Continued)

OTHER PUBLICATIONS

Abhijit M.; "On Pseudo-Random and Orthogonal Binary Spreading Sequences", World Academy of Science Engineering and Technology, vol. 2, 2008, pp. 543-550.

(Continued)

*Primary Examiner* — Lam T Mai
(74) *Attorney, Agent, or Firm* — McDermott Will & Emery LLP

(57) ABSTRACT

A delta-sigma modulator (10) comprises a modulator loop (11) and a code generator (12). The modulator loop (11) comprises a loop filter (18). The code generator (12) is configured to generate a generator signal (BS) that is realized as an extended Barker code. The code generator (12) comprises a generator output (23) that is coupled to the loop filter (18).

10 Claims, 15 Drawing Sheets

(56) References Cited

U.S. PATENT DOCUMENTS

| | | | | |
|---|---|---|---|---|
| 8,680,925 | B2* | 3/2014 | Christen | H03F 1/308 330/296 |
| 2004/0036636 | A1* | 2/2004 | Mai | H03M 7/3008 341/131 |
| 2007/0040718 | A1* | 2/2007 | Lee | H03M 7/3008 341/143 |
| 2007/0090980 | A1* | 4/2007 | Lin | H03M 3/33 341/143 |
| 2012/0049903 | A1* | 3/2012 | Oh | H03K 3/84 327/114 |
| 2013/0135131 | A1 | 5/2013 | Tai et al. | |

OTHER PUBLICATIONS

Koch, R. et al., "A 12-bit Sigma-Delta Analog-to-Digital Converter with a 15-MHz Clock Rate", IEEE Journal of Solid-State Circuits, vol. SC-21, No. 6, Dec. 1986, pp. 1003-1010.

Sailer, H. et al., "A VLSI Transceiver for the ISDN Customer Access", International Conference on Communications, IEEE, vol. 3, 1985, pp. 1448-1451.

Szechenyi, K. et al., "Integrated Full-Digital U-interface Circuit for ISDN Subscriber Loops", IEEE Journal on Selected Areas in Communications. vol. SAC-4, No. 8, Nov. 1986, pp. 1337-1349.

Trick, U., "Ein Vergleich von Integrierten Schaltungen fur die U-Schnittstelle im Digitalisierten Ortsnetz", NTZ Archiv, vol. 11, No. 5, Sep. 1989, pp. 211-219.

Matsuya, Y. et al., "A 16-bit Oversampling A-to-D Conversion Technology Using Triple-Integration Noise Shaping", IEEE, vol. SC-22, No. 6, Dec. 1987, pp. 921-929.

Fam, A, et al., "Multiplicative Mismatched Filters for Barker Codes", The State University of New York at Buffalo, retrieved from <www.courses.sens.buffalo.edu/.../ClassPresentations617.ppt> on Oct. 29, 2013, 21 pgs.

ST, "MEMS Audio Sensor Omnidirectional Digital Microphone", Datasheet MP34DB01, Doc ID 17924, Rev. 8, Jul. 2012; pp. 1-16.

Christen, T., "A 15-bit 140-μW Scalable-Bandwidth Inverter-Based ΔΣ Modulator for a MEMS Microphone with Digital Output", IEEE Journal of Solid-State Circuits, vol. 48, No. 7, Jul. 2013, pp. 1605-1614.

Norsworthy, S.R. et al., "Delta-Sigma Data Converters", IEEE, 1997, pp. 100-140.

Schreier, R. et al., "Understanding Delta-Sigma Data Converters", IEEE, 2005, pp. 40-49.

Schreier, R., "Noise-Shaped Coding", Ph.D. Thesis, University of Toronto, 1991, 104 pgs.

Schreier, R., "The Delta-Sigma Toolbox", Analog Devices, Inc., Version 7.3, Jul. 2009, 40 pgs.

* cited by examiner

FIG 3D

| length | Barker code | reversed Barker code | negated Barker code | negated and reversed Barker code |
|---|---|---|---|---|
| 2 | [1 -1] | [-1 1] | [-1 1] | [1 -1] |
| 2 | [1 1] | [1 1] | [-1 -1] | [-1 -1] |
| 3 | [1 1 -1] | [-1 1 1] | [-1 -1 1] | [1 -1 -1] |
| 4 | [1 -1 1 1] | [1 1 -1 1] | [-1 1 -1 -1] | [-1 -1 1 -1] |
| 4 | [1 -1 -1 -1] | [-1 -1 -1 1] | [-1 1 1 1] | [1 1 1 -1] |
| 5 | [1 1 1 -1 1] | [1 -1 1 1 1] | [-1 -1 -1 1 -1] | [-1 1 -1 -1 -1] |
| 7 | [1 1 1 -1 -1 1 -1] | [-1 1 -1 -1 1 1 1] | [-1 -1 -1 1 1 -1 1] | [1 -1 1 1 -1 -1 -1] |
| 11 | [1 1 1 -1 -1 -1 1 -1 -1 1 -1] | [-1 1 -1 -1 1 -1 -1 -1 1 1 1] | [-1 -1 -1 1 1 1 -1 1 1 -1 1] | [1 -1 1 1 -1 1 1 1 -1 -1 -1] |
| 13 | [1 1 1 1 1 -1 -1 1 1 -1 1 -1 1] | [1 -1 1 -1 1 1 -1 -1 1 1 1 1 1] | [-1 -1 -1 -1 -1 1 1 -1 -1 1 -1 1 -1] | [-1 1 -1 1 -1 -1 1 1 -1 -1 -1 -1 -1] |

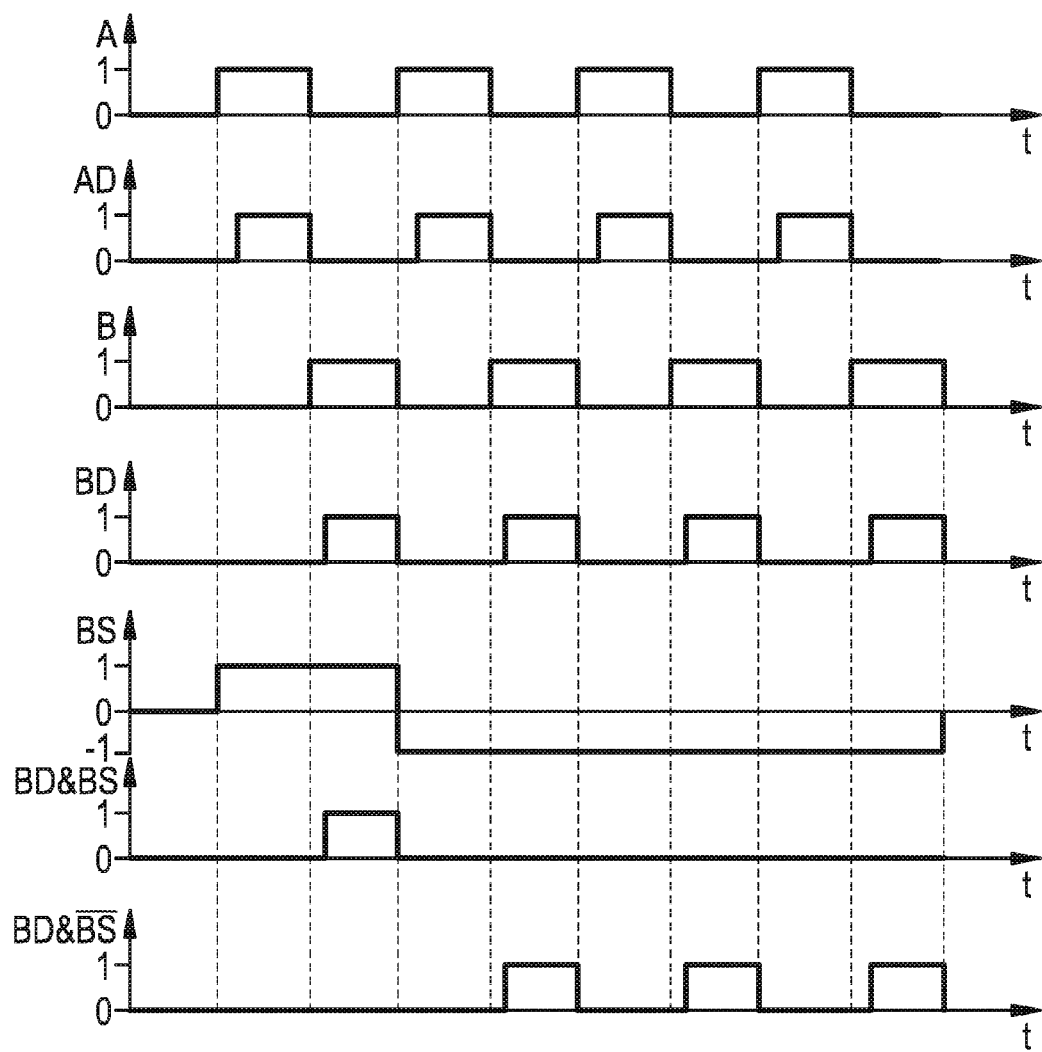

DELTA-SIGMA MODULATOR AND METHOD FOR SIGNAL CONVERSION

BACKGROUND OF THE INVENTION

The present application relates to a delta-sigma modulator, an arrangement with two delta-sigma modulators and to a method for signal conversion.

A delta-sigma modulator typically comprises a loop-filter, a quantizer and a feedback digital-to-analog converter. A single-bit delta-sigma modulator is popular primarily because of the inherent linearity of a single-bit feedback digital-to-analog converter. On the other hand, a single-bit quantizer makes the delta-sigma modulator a strongly non-linear system. The single-bit delta-sigma modulator consequently produces very large tones near the half of a sampling frequency, also referred to as idle tones, as a result of limit cycles. The idle tones are particularly relevant, if another signal near the half of the sampling frequency interferes with a bit stream of the delta-sigma modulator. In this case, a tone gets folded down, for example, in the baseband.

Document US 2013/0135131 A1 refers to an idle tone suppression circuit comprising a sigma-delta analog-to-digital converter.

Publication Y. Matsuya et al, "A 16-bit Oversampling A-to-D Conversion Technology Using Triple-Integration Noise Shaping", IEEE Journal of Solid-State Circuits, Vol. SC-22, pp. 921-929, 1987, describes a monolithic audio analog-to-digital converter.

SUMMARY OF THE INVENTION

In an embodiment, a delta-sigma modulator comprises a modulator loop and a code generator. The modulator loop comprises a loop filter. The code generator is configured to generate a generator signal that is an extended Barker code. The code generator comprises a generator output. The generator output is coupled to the loop filter.

Advantageously, the autocorrelation function of the generator signal realized as an extended Barker code shows very low off-peak values. Thus, the idle tone content within an output signal of the delta-sigma modulator has a low correlation, for example with an output signal of another delta-sigma modulator or a clock signal.

The code generator provides the generator signal via the generator output to the loop filter.

In an embodiment, every code of the extended Barker code contains at least the bits of a Barker code.

In an embodiment, the extended Barker code comprises a code out of a Barker code set. The Barker code set consists of the code [1 −1], the code [1 1], the code [1 1 −1], the code [1 −1 1 1], the code [1 −1 −1 −1], the code [1 1 1 −1 1], the code [1 1 1 −1 −1 1 −1], the code [1 1 1 −1 −1 −1 1 −1 −1 1 −1] and the code [1 1 1 1 1 −1 −1 1 1 −1 1 −1 1]. The codes have the length of 2, 3, 4, 5, 7, 11 or 13 bit.

Two codes are considered to be identical even if the sequence starts with a different phase that is with a different initial value. For example, the code [1 1 −1] is equal to the codes [1 −1 1] and [−1 1 1].

In another way of writing the codes, the above-mentioned codes may obtain a [0] instead of a [−1].

In an alternative embodiment, the extended Barker code comprises a reversed code of a code of the Barker code set. A reversed code is achieved by changing the order of the bits of the above-mentioned codes such that the first bit becomes the last bit and the last bit of the above-mentioned codes becomes the first bit of the reversed code.

In an alternative embodiment, the extended Barker code comprises a negated code of a code of the Barker code set. A negated code is defined in such a manner that in the above-mentioned Barker code set a [1] is replaced by a [−1], and a [−1] is replaced by a [1]. The extended Barker code also comprises the reversed form of the negated code of a code of the Barker code set. The codes of the Barker code set, the reversed codes and the negated codes result in very low values of the autocorrelation function.

In an alternative embodiment, the extended Barker code comprises a code achieved by adding a bit [1] or [−1] to one of the above-mentioned codes, that means the Barker code set as well as the reversed codes and the negated codes of the Barker code set. Optionally, the code having five bits, seven bits, eleven bits and thirteen bits are enlarged by one further bit. A code generator for providing such a code can be obtained in an easier way in comparison to a code generator for a Barker code without an odd number of bits.

In an alternative embodiment, the extended Barker code comprises a compound Barker code. The compound Barker code is realized by a combination of one of the above-mentioned codes with another of one of the above-mentioned codes. Thus, the length of the extended Barker code can be increased arbitrarily. For example, a compound Barker code can be realized by setting two different Barker codes in a series.

In an embodiment, every code of the extended Barker code is generated by using the bits of a Barker code or reverting or negating or reverting and additionally negating the bits of a Barker code or combining at least two Barker codes into a compound Barker code. In a further development, a bit [1] or a bit [0] is added at any place in the sequence of bits of the code.

In an embodiment, the code generator comprises logic gates. The logic gates may dynamically store the extended Barker code.

In an embodiment, the code generator comprises a counter. For the realization of a Barker code having a first number N bits, a counter with N bits is realized.

In an embodiment, the counter comprises at least one memory unit and a logic circuit. An input of the logic circuit is coupled to an output of the at least one memory unit. An output of the logic circuit is coupled to the output of the code generator. The at least one memory unit may be implemented as flip-flop.

In an embodiment, the modulator loop comprises a modulator input at which an input signal is received and a modulator output at which an output signal of the delta-sigma modulator is provided. The loop filter is arranged between the modulator input and the modulator output.

In an embodiment, the code generator provides a constant signal as the generator signal, when the input signal is higher than a predetermined value, and provides the extended Barker code signal, when the input signal is less than or equal to the predetermined value. Thus, the code generator only provides the extended Barker code in case of a low input signal at the modulator input.

In an alternative embodiment, the code generator provides a constant signal as the generator signal, when the output signal is higher than a predetermined value, and provides the extended Barker code signal, when the output signal is less than or equal to the predetermined value. Thus, the code generator only provides the extended Barker code in case of a low output signal at the modulator output.

In an embodiment, the constant signal is equal to zero. Thus, it is avoided to add the generator signal realized as the extended Barker code to existing signals of the modulator loop in case the input signal and/or the output signal obtain high values. Thus, the signals inside the modulator loop do not rise above a limit for operation.

In an embodiment, the delta-sigma modulator comprises a comparator having a first and a second comparator input and a comparator output. The first comparator input is coupled to the modulator input and/or to the modulator output. The predetermined value is provided to the second comparator input. The comparator output is coupled to an enable input of the code generator. The comparator may be implemented as a window comparator. A comparator signal provided by the comparator is applied to the enable input of the code generator. The code generator provides the constant signal, in case the comparator signal indicates that the signal at the first comparator input is larger than the signal at the second comparator input. Consequently, the code generator is designed for providing the extended Barker code, in case the signal at the first comparator input is equal or less than the predetermined value. Thus, only at a small input signal or a small output signal, the generator signal is implemented as the extended Barker code.

In an embodiment, the modulator loop comprises an adder. The adder comprises a first and a second adder input and an adder output. The first adder input is coupled to the modulator input. The second adder input is coupled to the modulator output. The adder output is coupled to an input of the loop filter. The first adder input may be implemented as a non-inverting input. The second adder input can be realized as an inverting input. Thus, the adder can be designed as a subtracting circuit.

In an embodiment, the modulator loop comprises a quantizer having an input coupled to an output of the loop filter and an output coupled to the modulator output. The quantizer can be implemented as a one-bit quantizer. The quantizer can be realized as a comparator, for example as a single-bit comparator. Alternatively, the quantizer is designed as a multi-bit quantizer.

In an embodiment, the modulator loop comprises a code adder. The code adder comprises a first and a second input and an output. The first input of the code adder is coupled to the output of the loop filter. The second input of the code adder is coupled to the signal generator. The output of the code adder is coupled to the input of the quantizer. Thus, the code generator is coupled to the loop filter via the code adder connected downstream of the loop filter.

In an embodiment, an input signal of the quantizer is a function of at least the generator signal. The generator signal may be used as a dithering code at the input of the quantizer.

Thus, the extended Barker code may generate dithering in a delta-sigma modulator. The extended Barker code may provide a decorrelation to another signal such as a clock or data signal. Advantageously, an intermodulation with another signal or a base band convolution may be avoided for example.

In an alternative embodiment, the loop filter comprises a further input that is coupled to the generator output. The loop filter may comprise more than one stage. The further input of the loop filter may be coupled to a node between two stages of the loop filter.

In an embodiment, an analog-to-digital converter comprises the delta-sigma modulator and a digital filter connected to the modulator output. Thus, the input signal is implemented as an analog signal and the output signal as a digital signal.

In an alternative embodiment, a digital-to-analog converter comprises the delta-sigma modulator and an analog filter connected to the modulator output. In this case, the input signal is realized as a digital signal and the output signal as an analog signal.

In an embodiment, a microphone arrangement comprises a first and a second microphone. The first microphone comprises a first transducer and a first read-out circuit comprising a first delta-sigma modulator. Moreover, the second microphone comprises a second transducer and a second read-out circuit comprising a second delta-sigma modulator. Additionally, the first and the second read-out circuit may each comprise an amplifier and a voltage reference source. The first and the second delta-sigma modulator is realized as the analog-to-digital converter. The generator signal that is realized as the extended Barker code signal of the first microphone is shifted in phase in respect to the generator signal that is realized as the extended Barker code signal of the second microphone.

In an embodiment, a data signal of the first microphone is a function of the output signal of the first delta-sigma modulator. Correspondingly, a data signal of the second microphone is a function of the output signal of the second delta-sigma modulator. Advantageously, the two idle tones within the data signals of the two microphones do not correlate, since the extended Barker code has a small off-peak value of an autocorrelation and the two extended Barker code signals of the two microphones are shifted in phase to each other. The shift is at least one bit.

In an embodiment, an arrangement comprises a first and a second delta-sigma modulator. The first and the second delta-sigma modulator each comprises a modulator loop and a code generator. The modulator loop comprises a loop filter. The code generator is configured to generate a generator signal that is realized as an extended Barker code. The code generator comprises a generator output that is coupled to the loop filter. The extended Barker code of the first delta-sigma modulator is shifted in phase with respect to the extended Barker code of the second delta-sigma modulator.

The generator signal of the first delta-sigma modulator may be identical to the generator signal of the second delta-sigma modulator besides a temporal non-zero shift.

In an embodiment, the arrangement comprises a digital signal processor. A data input of the digital signal processor is connected to a first data output of the first delta-sigma modulator and to a second data output of the second delta-sigma modulator.

In an embodiment, the first and the second delta-sigma modulator use a shared data line that connects the data outputs of the first and the second delta-sigma modulator to the data input of the digital signal processor.

In an embodiment, a clock output of the digital signal processor is connected to a clock input of the first delta-sigma modulator and to a clock input of the second delta-sigma modulator.

The arrangement may be realized as the microphone arrangement or another arrangement.

In an embodiment, a method for signal conversion comprises performing a delta-sigma modulation by a modulator loop of a delta-sigma modulator, wherein the modulator loop comprises a loop filter. A generator signal that is an extended Barker code is generated by a code generator and provided to the modulator loop.

Advantageously, the idle tone content within an output signal of the delta-sigma modulator has a low correlation to other signals.

In an embodiment, the generator signal is provided to a further input of the loop-filter or to a second input of a code adder of the modulator loop, wherein a first input of the code adder is coupled to an output of the loop-filter.

BRIEF DESCRIPTION OF THE DRAWINGS

Aspects of the invention will be described in detail below for several exemplary embodiments with reference to the figures. Components and circuit parts that are functionally identical or have the identical effect bear identical reference numbers. Insofar as components or circuit parts correspond to one another in function, a description of them will not be repeated in each of the following figures. Therein:

FIGS. 3A to 3D show embodiments of a code generator, an autocorrelation function and a table of an extended Barker code.

FIGS. 6A and 6B show an additional exemplary embodiment of the delta-sigma modulator.

DETAILED DESCRIPTION

Figure 1A:
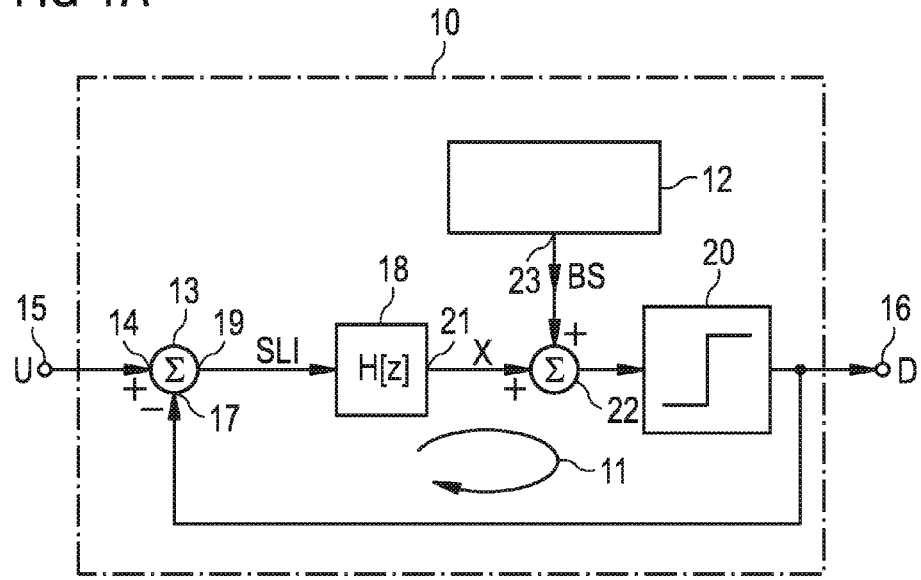
FIGS. 1A to 1C show exemplary embodiments of a delta-sigma modulator.

FIG. 1A show an exemplary embodiment of a delta-sigma modulator 10. The delta-sigma modulator 10 comprises a modulator loop 11 and a code generator 12. The modulator loop 11 comprises an adder 13 having a first adder input 14 coupled to a modulator input 15 of the delta-sigma modulator 10. The delta-sigma modulator 10 comprises a modulator output 16 that is coupled to a second adder input 17 of the adder 13. Moreover, the modulator loop 11 comprises a loop filter 18 that is coupled on its input side to an adder output 19 of the adder 13. The loop filter 18 may comprise an integrator. The loop filter 18 has a filter characteristic H[z] or H(s). The loop-filter 18 may be implemented as a discrete-time filter, a continuous-time filter or a combined discrete-time and continuous-time filter.

Furthermore, the modulator loop 11 comprises a quantizer 20 that is coupled on its input side to a loop filter output 21 of the loop filter 18. The quantizer 20 can be implemented as comparator. An output of the quantizer 20 is coupled to the modulator output 16. Moreover, the modulator loop 11 comprises a code adder 22. The code adder 22 is located between the loop filter 18 and the quantizer 20. A first input of the code adder 22 is coupled to the loop filter output 21. A second input of the code adder 22 is coupled to the code generator 12 via a generator output 23. An output of the code adder 22 is coupled to the input of the quantizer 20. Thus, the modulator loop 11 comprises a series circuit of the adder 13, the loop filter 18, the code adder 22 and the quantizer 20, wherein the quantizer 20 is connected again to the adder 13 for closing the modulator loop 11. The delta-sigma modulator 10 may be of the single-bit type.

The code generator 12 generates a generator signal BS that is applied to the second input of the code adder 22. The generator signal BS is formed using a binary code. The generator signal BS comprises an extended Barker code. The loop filter 18 generates a filter output signal X that is applied to the first input of the code adder 22. The adder 22 performs a summing of the generator signal BS and of the filter output signal X and provides the sum of the signals to the input of the quantizer 20. The quantizer 20 generates an output signal D that can be tapped at the modulator output 16. The output signal D is provided to the second adder input 17. An input signal U is applied via the modulator input 15 to the first adder input 14. The adder 14 generates an adder output signal SLI by summing the input signal U and the output signal D. The adder output signal SLI is provided to the loop filter 18.

Advantageously, a binary code sequence such as the Barker code sequence is added in front of the quantizer 20 into the delta-sigma modulator 10. The output signal D is gained by delta-sigma modulation of the input signal U. The output signal D mainly depends on the input signal U and to a small extent also to the generator signal BS. Since the generator signal BS realized as an extended Barker code has a small autocorrelation value, it decorrelates the idle tone with respect to other signals.

In an alternative embodiment, not shown, the modulator loop 11 comprises a feedback filter, an analog-to-digital converter, a digital-to-analog converter and/or a delay element that is arranged between the modulator output 16 and the second adder input 17. The digital-to-analog converter may be realized as a single-bit digital-to-analog converter.

Figure 1B:
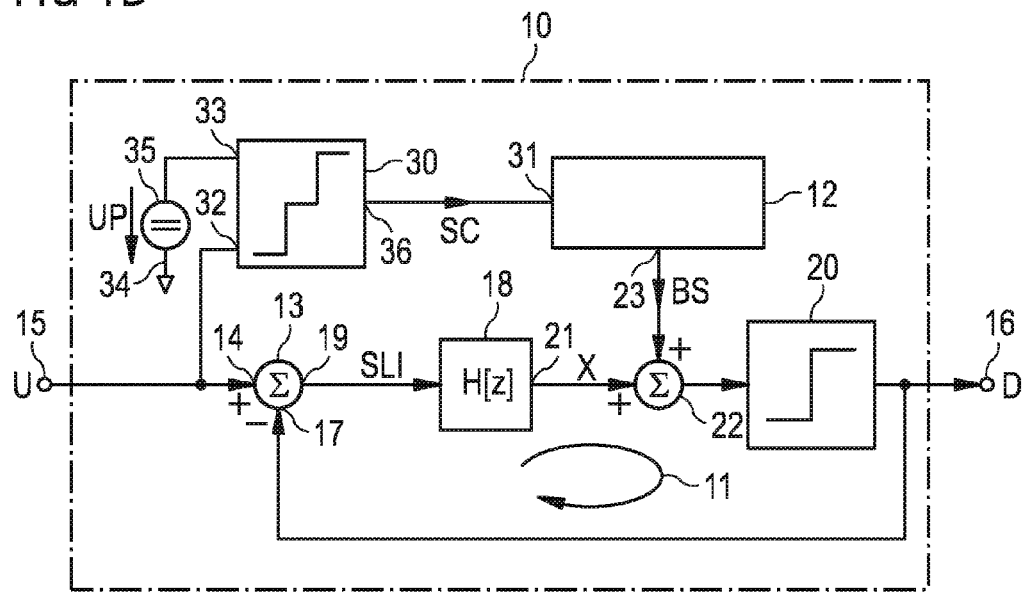

FIG. 1B shows an alternative embodiment of the delta-sigma modulator 10 which is a further development of the delta-sigma modulator shown in FIG. 1A. The delta-sigma modulator 10 comprises a comparator 30. A comparator output 36 of the comparator 30 is coupled to an enable input 31 of the code generator 12. The comparator 30 comprises a first comparator input 32 that is coupled to the modulator input 15. A second comparator input 33 is coupled to a reference potential terminal 34 via a comparator reference source 35.

The input signal U is provided to the first comparator input 32. The comparator reference source 35 generates a predetermined value UP. The predetermined value UP is applied to the second comparator input 33. The comparator 30 provides a comparator signal SC that is tapped at the comparator output 36. The comparator signal SC is a function of a comparison of the input signal U and the predetermined value UP. The comparator signal SC is applied to the enable input 31 of the code generator 12. When the input signal U is larger than the predetermined value UP, the comparator signal SC sets the code generator 12 in such a mode that the generator signal BS of the code generator 12 is constant. The constant value of the generator signal BS may be zero. When the input signal U is equal or less than the predetermined value UP, the comparator signal SC sets the code generator 12 in such a mode that the generator signal BS is the extended Barker code.

The adding of a code such as the extended Barker code into the modulator loop 11 may reduce the useable input signal range, since the modulator 10 gets unstable earlier because the code uses part of the stable input range. This issue can be mitigated by the adaptive code amplitude as shown in FIG. 1B. The extended Barker code is switched on only for small input signals U, where the idle tone issue exists. For larger input signals U, there is typically no idle tone, and, therefore, the extended Barker code can be disabled. Thus, the code generator 12 generates an adaptive binary code.

In an alternative embodiment, the comparator 30 is realized as a window comparator. When the input signal U is in a range between minus the predetermined value UP and plus the predetermined value UP, then the generator signal BS comprises the extended Barker code. When the input signal U is higher than the predetermined value UP or less than minus the predetermined value UP, then the generator signal BS is constant, optionally zero. Instead of a window comparator, two comparators can be coupled to the modulator input 15.

Figure 1C:
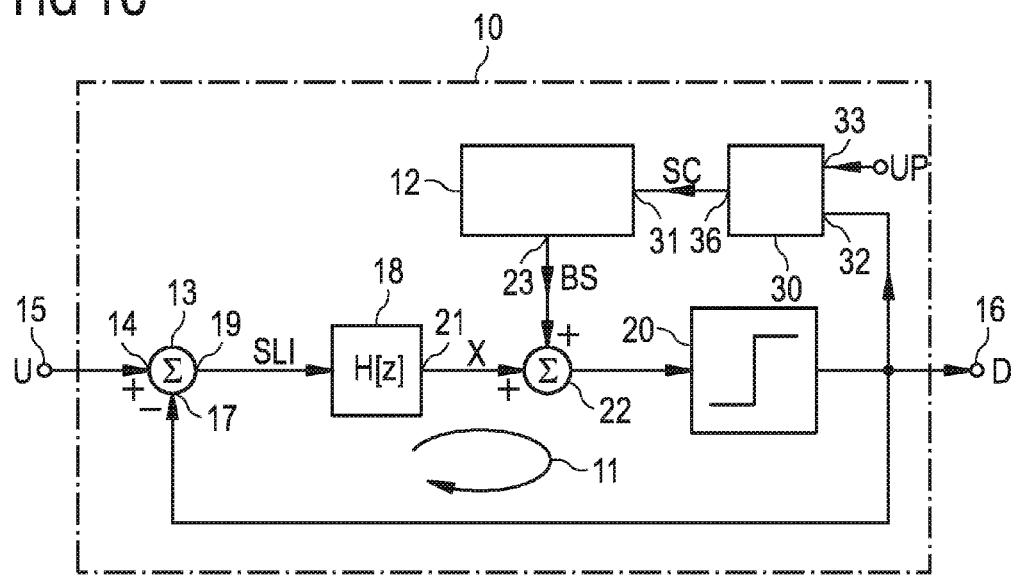

FIG. 1C shows a further exemplary embodiment of the delta-sigma modulator 10 which is a further development of the delta-sigma modulator shown in FIGS. 1A and 1B. The comparator 30 is coupled to the modulator output 16 on its input side. Thus, the first comparator input 32 is connected to the modulator output 16. In case the output signal D is a digital signal, the comparator 30 is implemented as a digital comparator. Then, the comparator 30 compares the digital output signal D with a digital predetermined value UP.

Figure 2:
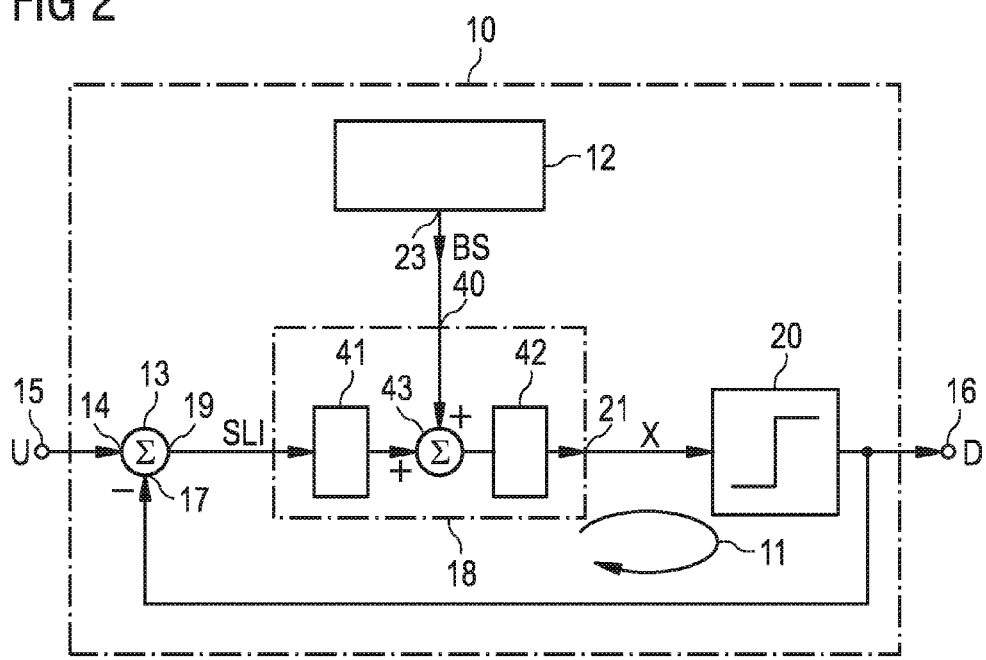
FIG. 2 shows an alternative embodiment of a delta-sigma modulator.

FIG. 2A shows a further exemplary embodiment of the delta-sigma modulator 10 which is a further development of the delta-sigma modulator shown in FIGS. 1A to 1C. The loop filter 18 comprises a further input 40. The code generator 12 is coupled via the generator output 23 to the further input 40 of the loop filter 18. Thus, the code adder 22 is omitted and replaced by a direct connection of the loop filter output 21 to the input of the quantizer 20. The loop filter 18 comprises a first and a second filter stage 41, 42. The first and the second filter stage 41, 42 are arranged in series. The first filter stage 41 is coupled to the input of the loop filter 18, whereas the second filter stage 42 is coupled to the loop filter output 21. The loop filter 18 comprises an internal adder 43 that is arranged between the first filter stage 41 and the second filter stage 42. The further input 40 of the loop filter 18 is connected to an input of the internal adder 43. An output of the first filter stage 41 is coupled to a further input of the internal adder 43. An output of the internal adder 43 is coupled to the second filter stage 42. Thus, the generator signal BS influences a signal that can be tapped inside of the loop filter 18.

In an alternative, not shown embodiment, the loop filter 18 comprises further stages that are connected in series to the first filter stage 41 or/and the second filter stage 42.

In an alternative, not shown embodiment, the delta-sigma modulator 10 comprises the comparator 30. The comparator 30 is connected on its input side either to the modulator input 15 as shown in FIG. 1B or to the modulator output 16 as shown in FIG. 1C. The comparator 30 is connected via the comparator output 36 to the enable input 31 of the code generator 12 as shown in FIGS. 1B and 1C.

Advantageously, a binary code such as the extended Barker code is injected into the modulator loop 11. The code is chosen so that is has minimum correlation to the disturbance. For example, code sequences with small off-peaks in the autocorrelation function and different start values can be used for two microphones in stereo mode. The binary code is disabled for larger input signals U to mitigate a reduction in the stable input range of the delta-sigma modulator 10.

Figure 3A:
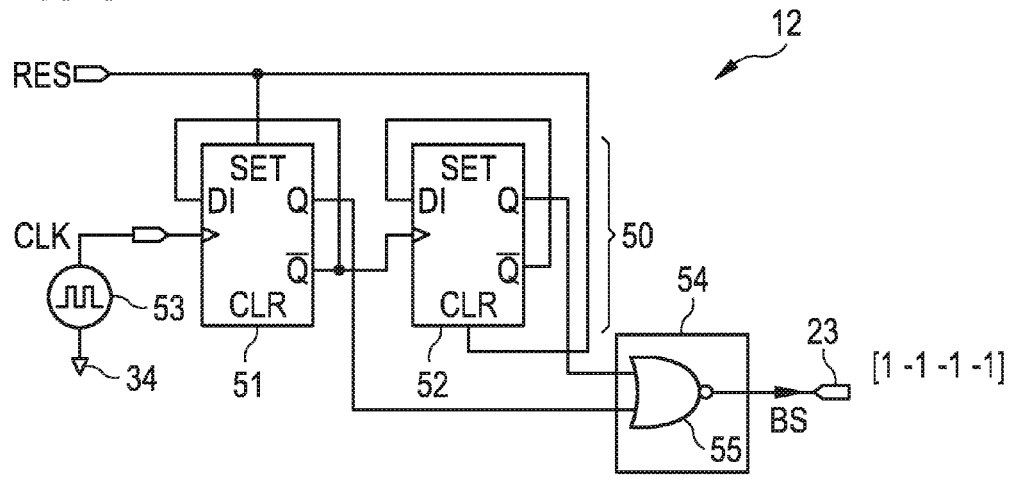

FIG. 3A shows an exemplary embodiment of the code generator 12. The code generator 12 comprises a counter 50. The counter 50 at least comprises one memory unit 51. The counter 50 is realized by a series of memory units 51, 52. At least one memory unit 51, 52 may be implemented as a flip-flop. The flip-flop may be designed as a D-flip-flop.

The delta-sigma modulator 10 comprises a logic circuit 54 coupled on its input side to the series of memory units 51, 52. The delta-sigma modulator 10 comprises a clock generator 53. The clock generator 53 generates a clock signal CLK. The clock generator 53 is coupled to a clock input C of the first memory unit 51. An inverted data output $\bar{Q}$ of the first memory unit 51 is coupled to a clock input C of the second memory unit 52. The inverted data output $\bar{Q}$ of the first memory unit 51 is also connected to a data input DI of the first memory unit 51. An inverted data output $\bar{Q}$ of the second memory unit 52 is connected to a data input DI of the second memory unit 51. A data output Q of the first memory unit 51 and a data output Q of the second memory unit 52 are coupled to the logic circuit 54. The logic circuit 54 comprises a NOR gate 55 having two inputs that are connected to the data outputs Q of the first and the second memory unit 51, 52. An output of the logic circuit 54 is connected via the generator output 23 to the modulator loop 11. The generator signal BS can be tapped at the output of the logic circuit 54. The extended Barker code has the sequence [1 0 0 0] which corresponds to the sequence [1 −1 −1 −1].

In an alternative embodiment, not shown, the clock generator 53 is connected to each of the clock inputs C of the series of memory units 51, 52.

Figure 4A:
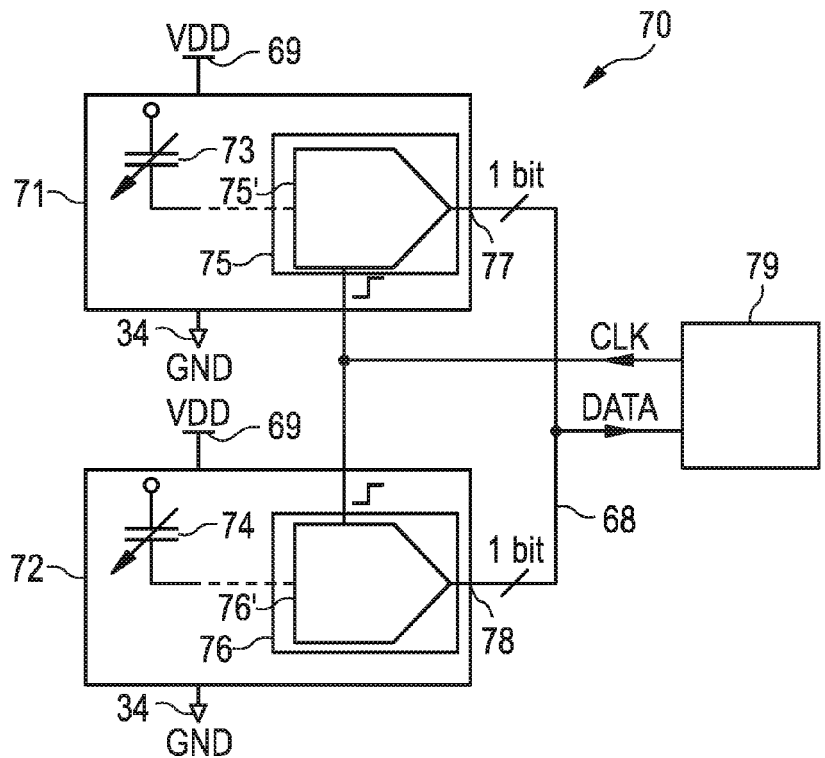
FIGS. 4A to 4G show an exemplary embodiment of a microphone arrangement and of signals that can be detected in the microphone arrangement.

In an alternative embodiment, not shown, the clock signal CLK is provided by an external circuit such as a digital signal processor 79 as shown in FIG. 4A. The delta-sigma modulator 10 may be free of an oscillator or clock generator.

Figure 3B:
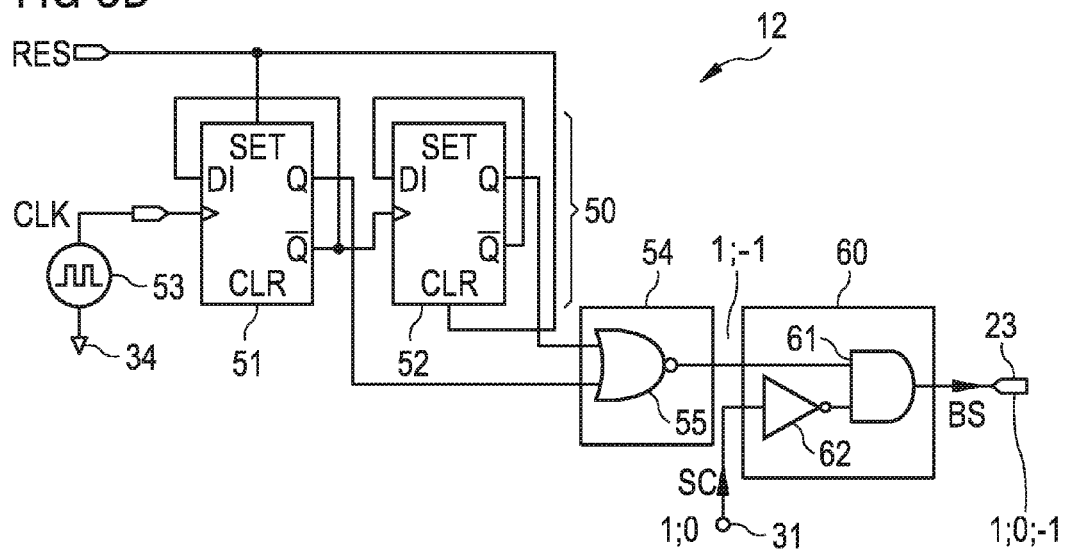

FIG. 3B shows a further exemplary embodiment of the code generator 12 that is a further development of the code generator shown in FIG. 3A. The code generator 12 can be inserted in the delta-sigma modulator 10 illustrated in FIGS. 1B and 1C. The code generator 12 comprises a generator logic 60. The generator logic 60 is connected on its input side to the output of the logic circuit 54 and to the enable input 31 of the code generator 12. The generator logic 60 is connected on its output side to the generator output 23.

The generator logic 60 may, for example, comprise an AND gate 61 that is coupled on its input side to the output of the logic 54 and to the enable input 31. An inverter 62 of the generator logic 60 is arranged between the enable input 31 and the AND gate 61. An output of the AND gate 61 is connected via an output of the generator logic 60 to the generator output 23.

The generator logic 60 provides an output signal of the logic 54 to the generator output 23 as a function of the comparator signal SC. When the input signal U is equal or less than the predetermined value UP, the signal at the output of the logic 54 is provided to the generator output 23 by the generator logic 60, resulting in the generator signal BS having the values +1 and −1. When the input signal U is higher than the predetermined value UP, the generator signal BS is constant and, for example, has the value zero. To summarize, the generator signal BS may have the values 1, 0 and −1.

Figure 3C:
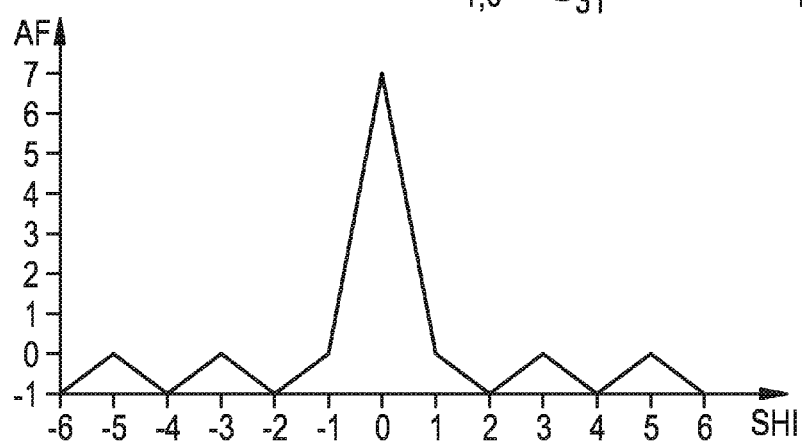

FIG. 3C shows an exemplary embodiment of an autocorrelation function of an extended Barker code signal with length 7. A value of the autocorrelation function AF versus a shift SHI is illustrated. Thus, for the calculation, a seven bit Barker code signal was used. The Barker code signal has the values [1 1 1 −1 −1 1 −1]. The autocorrelation function AF has the values 0 or −1 for any shift SHI besides the shift 0 and the value 7 for the shift SHI having the value 0. Therefore, a minimum correlation is achieved for any phase shift between two codes.

In an alternative embodiment, not shown, other sequences might be used as well, as long as they achieve small off-peaks in the autocorrelation function. Thus, the generator signal BS may be formed by other codes besides the extended Barker codes. The generator signal BS may comprise a pseudo-random sequence. However, the autocorrelation function of the pseudo-random sequence may have higher values.

FIG. 3D shows a table of the extended Barker code. The extended Barker code comprises the codes of the Barker code set, the reversed codes, the negated codes and the reversed and negated codes.

The Barker code is defined such that the amount of the value of the autocorrelation function AF has at most the value 1 in case of a shift SHI different from 0.

Thus, the generator signal BS that implements a code of the Barker code set, a reversed code, a negated code or a reversed and negated code of the Barker code set follows the equation:

$$-1 \leq AF(BS) \leq +1 \text{ for } SHI \neq 0,$$

wherein AF(BS) is the value of the autocorrelation function of the generator signal BS and SHI is the value of a shift.

In addition, the extended Barker code may comprise one of the codes shown in the table, wherein a bit [1] or a bit [0] is added at any place in the sequence of bits of the code. In this case, the autocorrelation function AF may obtain values more than 1 or less than −1. Optionally, only one bit is added. Alternatively, more than one bit are added.

Furthermore, the extended Barker code comprises a compound Barker code that is generated by combining one of the codes listed in the table with another code listed in the table. A compound Barker code is achieved by setting two different Barker codes one after the other. For generating the compound Barker code, also codes generated by adding a bit [1] or a bit [−1] to one of the codes shown in the table can be used. Two different Barker codes may be serially added to form the compound Barker code.

Optionally, the extended Barker code has a length of more than two. Optionally, the extended Barker code has a length of more than four.

However, the two-bit codes [1 −1] and [1 1] can be added in series to another Barker code for generating a compound Barker code. Even if these two-bit codes seem to be less efficient than longer codes if used alone, they can be part of a compound Barker code implemented by the code generator 12.

In an embodiment, the extended Barker code is not implemented by the codes [1 1] and [−1 −1].

Optionally, the extended Barker code is chosen such that an average value of the bits of the extended Barker code is zero or nearly zero. The seven-bit and eleven-bit Barker codes have a nearly zero average value.

In an embodiment, every code of the extended Barker code contains at least the bits of a Barker code.

In an embodiment, every code of the extended Barker code is set by using the bits of a Barker code or reverting or negating or reverting and additionally negating the bits of a Barker code or combining at least two Barker codes to a compound Barker code.

In a further development, a bit [1] or a bit [0] is added at any place in the sequence of bits of the code.

FIG. 4A shows an exemplary microphone arrangement 70 having a first and a second microphone 71, 72. Each of the microphones 71, 72 comprises a transducer 73, 74 and a read-out circuit 75, 76 which comprises a delta-sigma modulator 75', 76'. The delta-sigma modulators 75', 76' are realized as one of the delta-sigma modulators shown in the FIGS. 1A to 1C, 2, 5A to 5D and 6A. The first transducer 73 of the first microphone 71 is coupled via the first read-out circuit 75 of the first microphone 71 to a first data output 77 of the first microphone. Correspondingly, the second transducer 74 of the second microphone 72 is coupled via the second read-out circuit 76 of the second microphone 72 to a second data output 78 of the second microphone 72. The microphone arrangement 70 comprises a digital signal processor 79. The digital signal processor 79 may be implemented as a coding-decoding circuit, abbreviated to codec circuit. A data input of the digital signal processor 79 is connected to the first data output 77 and to the second data output 78. Both microphones 71, 72 use a shared data line 68 that connects the data outputs 77, 78 to the data input of the digital signal processor 79. A clock output of the digital signal processor 79 is connected to a clock input of the first microphone 71 and to a clock input of the second microphone 72 and, thus, to the clock inputs of the first and the second delta-sigma modulator 75', 76'. Both microphones 71, 72 are connected to a supply terminal 69 and to the reference potential terminal 34. The first microphone 71 is called a left-channel microphone. Consequently, the second microphone 72 is named a right-channel microphone. Both transducers 73, 74 are realized as micro-electro-mechanical system transducers, abbreviated MEMS transducers. Thus, the microphones 71, 72 can be named MEMS microphones. Alternatively, the first and the second transducer 73, 74 are implemented as electret microphone.

The digital signal processor 79 generates the clock signal CLK for the first and the second microphone 71, 72. The first microphone 71 drives data on the negative clock signal CLK, whereas the second microphone 72 drives data on the positive clock signal CLK.

The first and the second microphone 71, 72 each provide a pulse density modulated data signal at the respective data output 77, 78. The first microphone 71 provides data at the falling edge of the clock signal CLK, whereas the second microphone 72 provides data at the rising edge of the clock signal CLK. The digital signal processor 79 separately decodes the data of the first and of the second microphone 71, 72. The digital signal processor 79 filters the modulated data which have a high sample rate back to an audio frequency band. The first microphone 71 represents a left channel and the second microphone 72 correspondingly represents a right channel.

Advantageously, the number of connecting lines between the two microphones 71, 72 and the digital signal processor 79 can be kept low.

Advantageously, the idle tone in the modulator spectrum is reduced by the first delta-sigma modulator 75' comprising a code generator 12 and also by the second delta-sigma modulator 76' comprising a further code generator 12. Moreover, the intermodulation product between the idle tones of the two bit-streams of the two delta-sigma modulators 75', 76' is reduced. Two sequences which have minimum correlation between each other are used for each microphone 71, 72. Barker codes are well suited for this purpose. Barker codes are finite binary code sequences with minimum off-peak autocorrelation coefficients. It is conjectured that only seven known binary Barker codes exist. Using a Barker binary sequence with different start values for each microphone 71, 72, depending on the left or right channel of the two microphones 71, 72 sharing the same data bus 68, guarantees minimum correlation between the idle tones in the two output bit-streams. The microphone arrangement 70 achieves a lower idle tone intermodulation at less degradation in the noise floor compared to conventional techniques, such as dithering.

The code generator 12 of the first delta-sigma modulator 75' and the code generator 12 of the second delta-sigma modulator 76' may use the same extended Barker code, but with a shift in the extended Barker code. For example, the first delta-sigma modulator 75' may use the sequence [1 1 1 −1 −1 1 −1], whereas the second delta-sigma modulator 76' may use the sequence [1 −1 −1 1 −1 1 1]. Using different start values depending whether the microphone 71, 72 is used for the left or right channel (stereo configuration with two microphones 71, 72 on the same data bus), minimum correlation is achieved between the two code sequences.

Figure 4B:
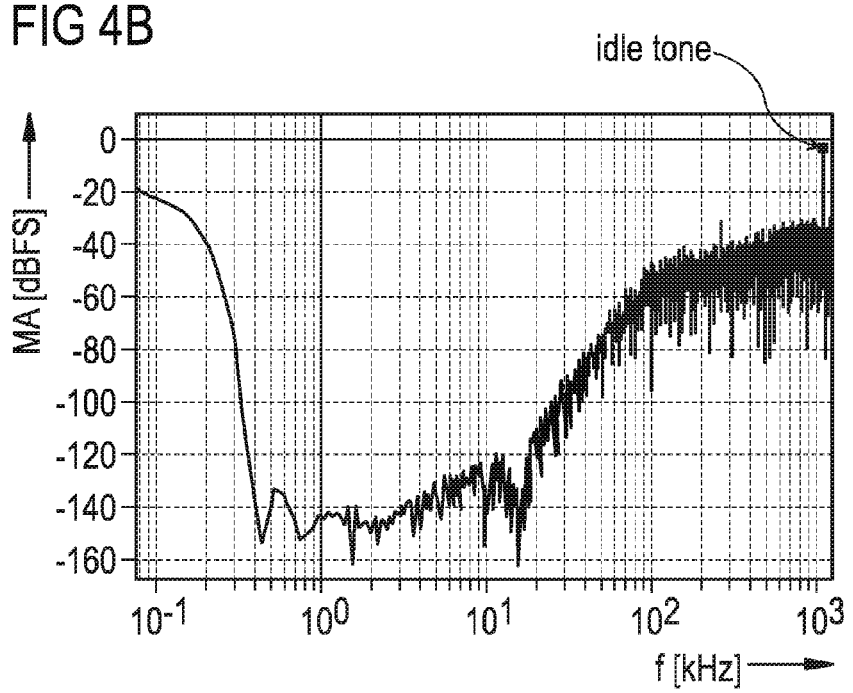

FIG. 4B shows an exemplary characteristic of a microphone such as a first and a second microphone 71, 72. In FIG. 4B, the frequency spectrum of a microphone is shown, wherein a DC input is provided to the modulator input 15 of the delta-sigma modulator 75'. A magnitude MA of the output signal U versus a frequency f is illustrated. FIG. 4B is achieved by a Matlab simulation.

Figure 4C:
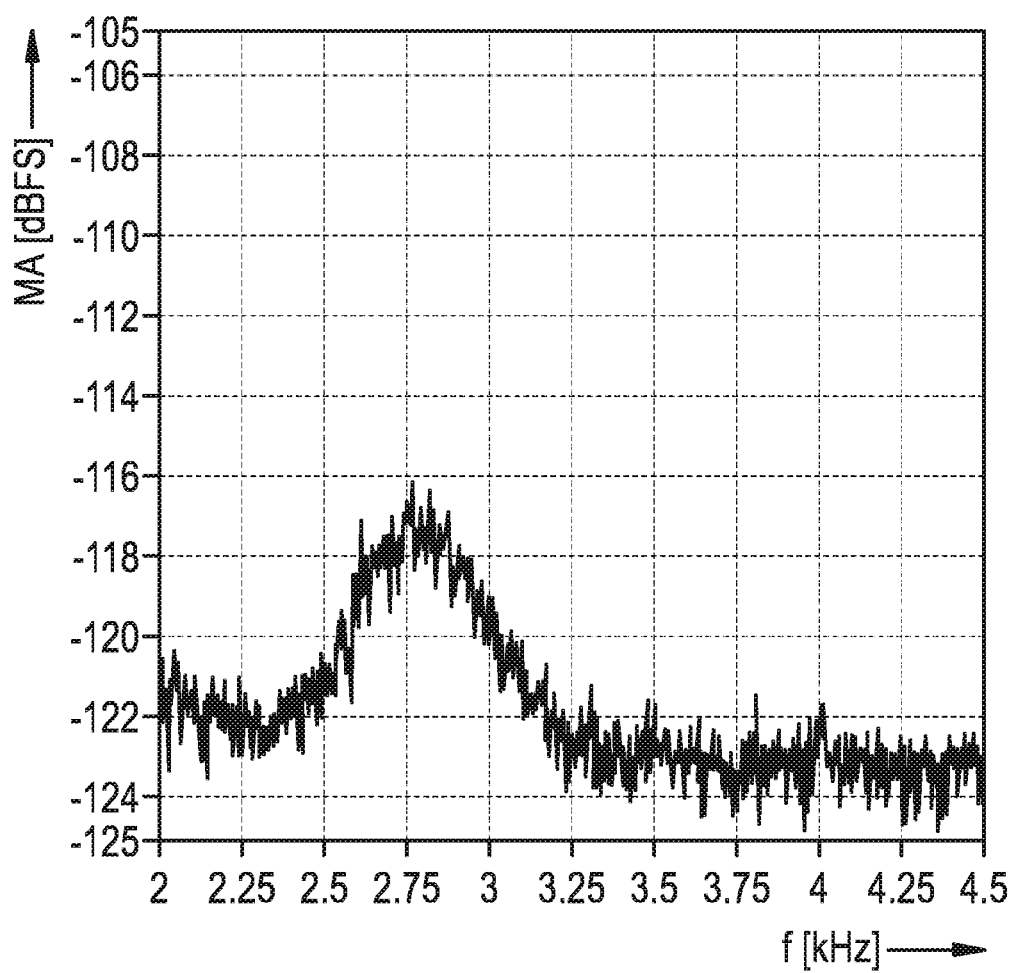

FIG. 4C shows an exemplary characteristic of two microphones 71, 72. The magnitude MA versus the frequency f is shown. A measured output bitstream of the first MEMS microphone 71 is illustrated with the second microphone 72 sharing the same data bus 68 without using a code generator 12. The tone at 2.75 kHz, which is the difference between the tones around the half of the sampling frequency $f_s/2$ of the two microphones 71, 72, is clearly visible in the spectrum. In spite of being close to the noise floor, this baseband tone is perceived as a whistling and, therefore, also referred to as bird noise. A limit cycle becomes particularly troublesome, if another signal near the half of the sampling frequency $f_s/2$ interferes with the delta-sigma modulator bit-stream. In this case, the tone gets folded down into the baseband. This can be observed with two digital MEMS microphones 71, 72 with pulse-density modulated outputs sharing the common data line 68 (stereo configuration). Because the microphones 71, 72 use a non-return-to-zero (NRZ) scheme for the data output, the frequency conversion product ($|f_{s,mic2}-f_{s,mic1}|$) of the two tones appears in the signal-band, if the code generator 12 is omitted.

In FIGS. 4D to 4G, a comparison of the microphone arrangement 70 using the extended Barker code with conventional dithering is elucidated.

Figure 4D:
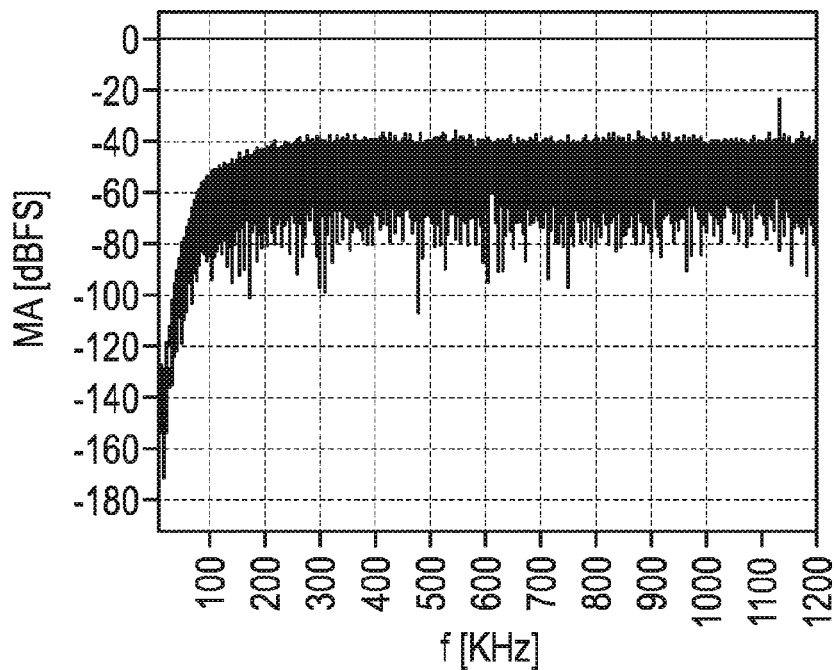
Figure 4E:
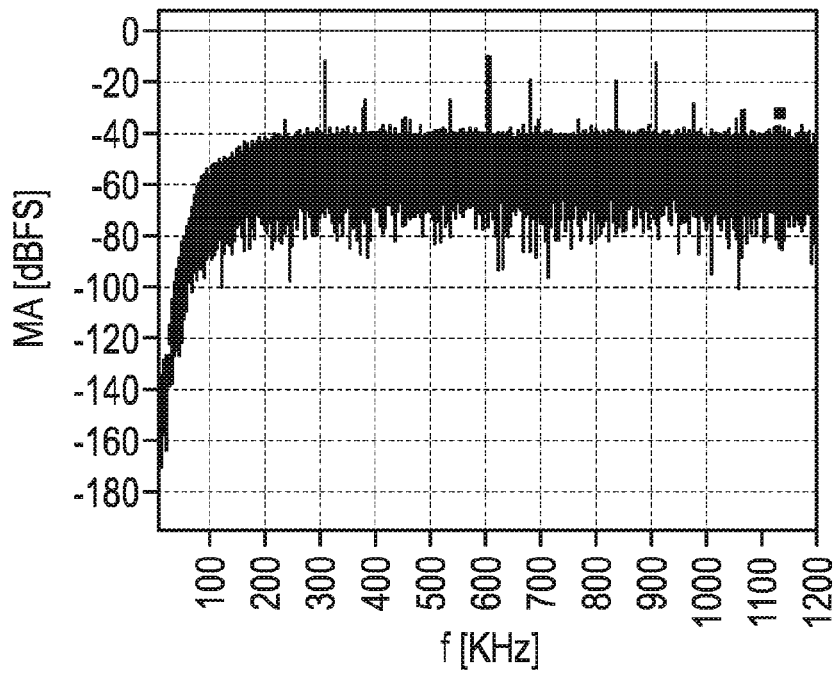

FIGS. 4D and 4E show exemplary characteristics of the output signal D of a delta-sigma modulator. The magnitude MA of the output signal D as a function of the frequency f is shown. Whereas in FIG. 4D an output spectrum of a single delta-sigma modulator with dithering is shown, the output spectrum of the single delta-sigma modulator 10 using a modified 3 bit Barker code sequence is illustrated in FIG. 4E. The dithering is achieved by adding a pseudo-random noise sequence to the input of the quantizer 20 or an integrator stage of the loop filter 18. The dithering aims at de-correlating the quantization error from the input. In FIG. 4E, the noise floor is less degraded compared to FIG. 4D and the magnitude MA of the idle tone at 1100 kHz is reduced more efficiently. The additional peaks in the output spectrum shown in FIG. 4E are located at known frequencies such that the influence of the additional peaks can be reduced and can be filtered by a sinc filter comprised by a decimation filter of the digital signal processor 79. The parameters of the sinc filter are chosen such that the additional peaks are reduced.

Figure 4F:
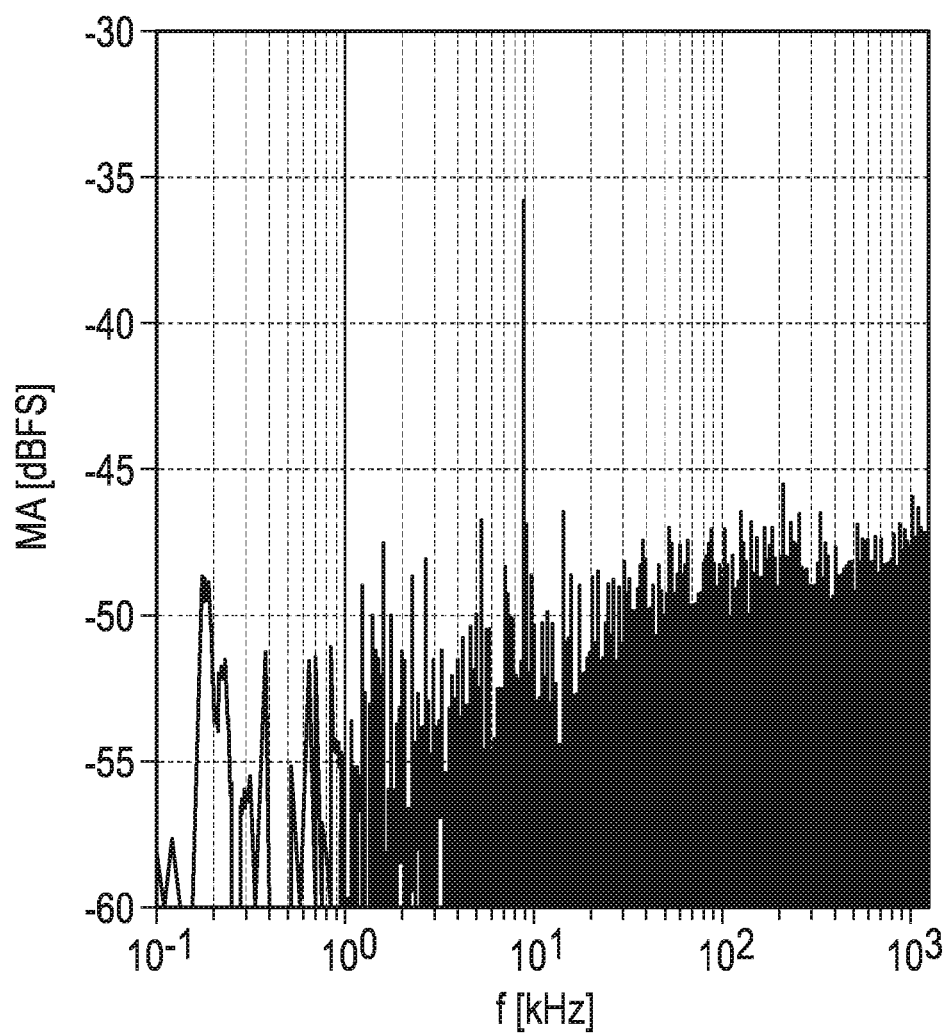
Figure 4G:
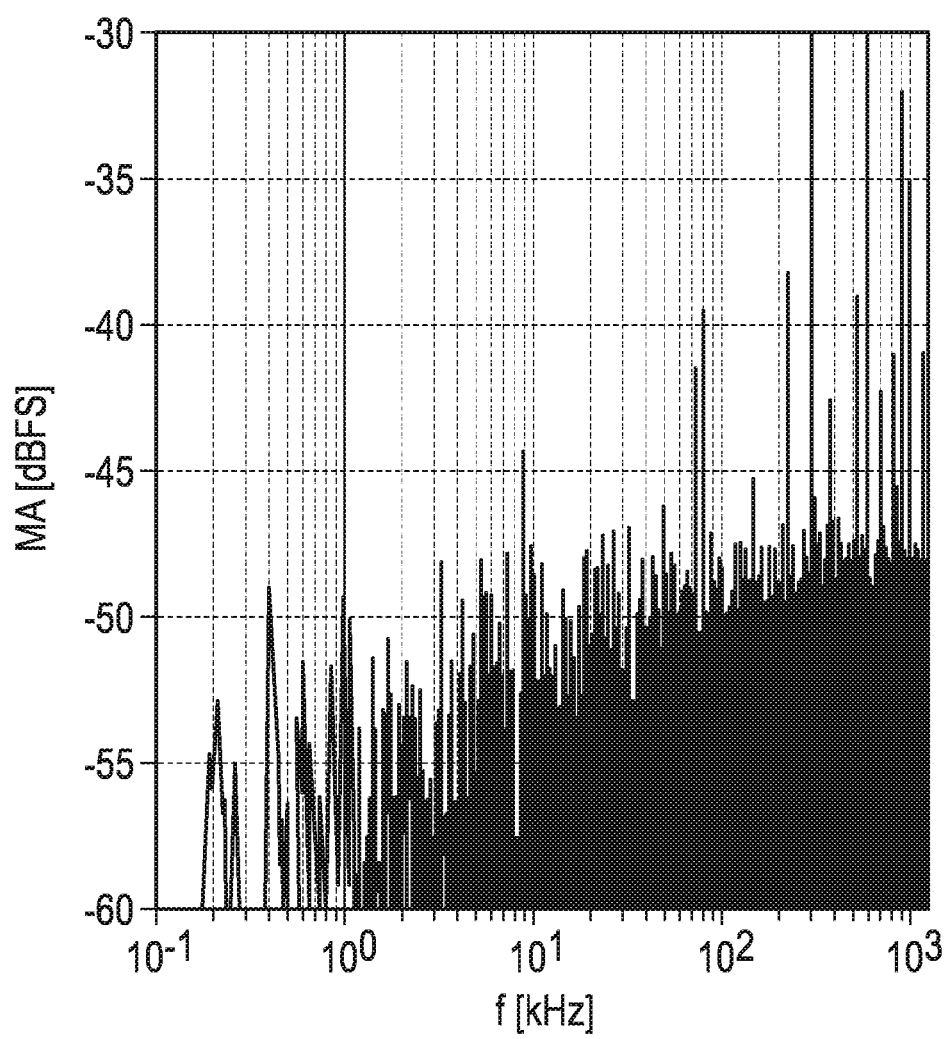

FIGS. 4F and 4G show an intermodulation product of the first and the second microphone 71, 72. Whereas dithering is used to achieve the intermodulation product shown in FIG. 4F, the modified 3 bit Barker code sequence is applied for achieving the intermodulation product shown in FIG. 4G. The high peak at about 10 kHz shown in FIG. 4F is very much reduced by the use of the modified 3 bit Barker code sequence as shown in FIG. 4G. FIGS. 4F and 4G are results of a Matlab simulation of the intermodulation of two delta-sigma modulator bit-streams which are generated by two digital pulse density modulated MEMS microphones 71, 72 sharing the same data bus 68. The Barker code sequence results in an 8 dB lower intermodulation product at 1.5 dB less quantization noise degradation compared to the dithering shown in FIGS. 4D and 4F. Advantageously, the first and the second delta-sigma modulators 75', 76' perform an idle tone intermodulation suppression. The first and the second delta-sigma modulators 75', 76' are realized as single-bit modulators.

Figure 5A:
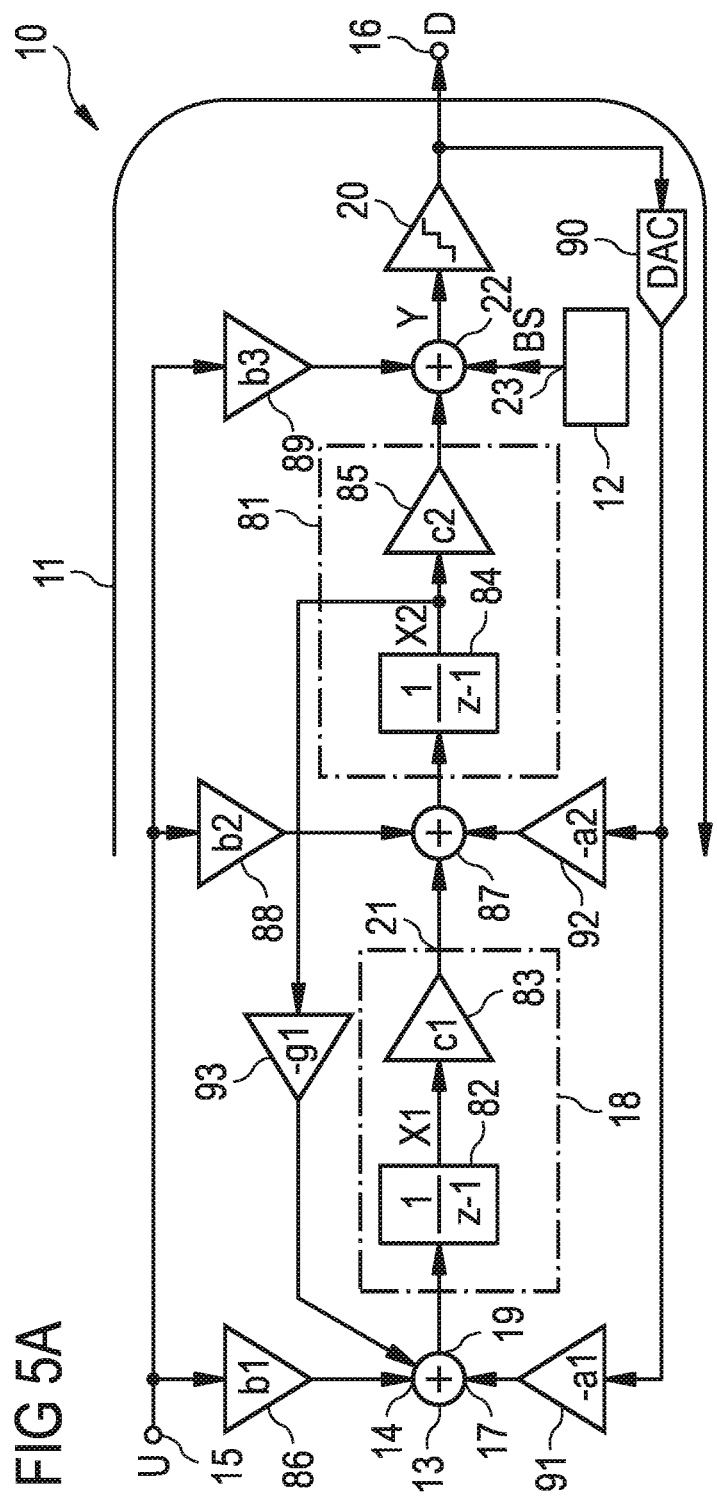
FIGS. 5A to 5D show further exemplary embodiments of the delta-sigma modulator.

FIG. 5A shows a further exemplary embodiment of the delta-sigma modulator 10 which is a further development of the delta-sigma modulator shown in FIGS. 1A to 1C and 2. The delta-sigma modulator 10 is implemented as a chain of integrators with distributed feedback, abbreviated to CIFB. The delta-sigma modulator 10 is of an even order, namely of the second order. Thus, the delta-sigma modulator 10 comprises the loop filter 18 and a further loop filter 81. The loop filter 18 comprises a first delaying integrator 82 and a first filter 83 that are arranged in series. The further loop filter 81 comprises a second delaying integrator 84 and a second filter 85 which are connected in series.

The modulator input 15 is coupled via a first input filter 86 to the first adder input 14. The adder output 19 is coupled via the loop filter 18 to a further adder 87. An output of the further adder 87 is coupled via the further loop filter 81 to the code adder 22. The code generator 12 is coupled to a further input of the code adder 22. The modulator input 15 is coupled via a second input filter 88 to a further input of the further adder 87. A third input filter 89 couples the modulator input 15 to a further input of the code adder 22. The output of the code adder 22 is coupled to the input of the quantizer 20. The output of the quantizer 20 is coupled to the modulator output 16 and via a digital-to-analog converter 90 to the second adder input 17. A first feedback filter 91 is arranged between the digital-to-analog converter 90 and the second adder input 17. The output of the digital-to-analog converter 90 is additionally coupled via a second feedback filter 92 to a further input of the further adder 87. A node between the second delaying integrator 84 and the second filter 85 is coupled via a feedback filter 93 to a further input of the adder 13. The loop filter 18 and the further loop filter 81 form a resonator.

The generator signal BS is provided to the input of the code adder 22 that is arranged between the further loop filter 81 and the quantizer 20.

In an alternative, not shown embodiment, the code generator 12 is coupled to another circuit of the delta-sigma modulator 10. The generator signal BS can be added to another node in the delta-sigma modulator 10, for example to a further input of the adder 13 or the further adder 87.

Figure 5B:
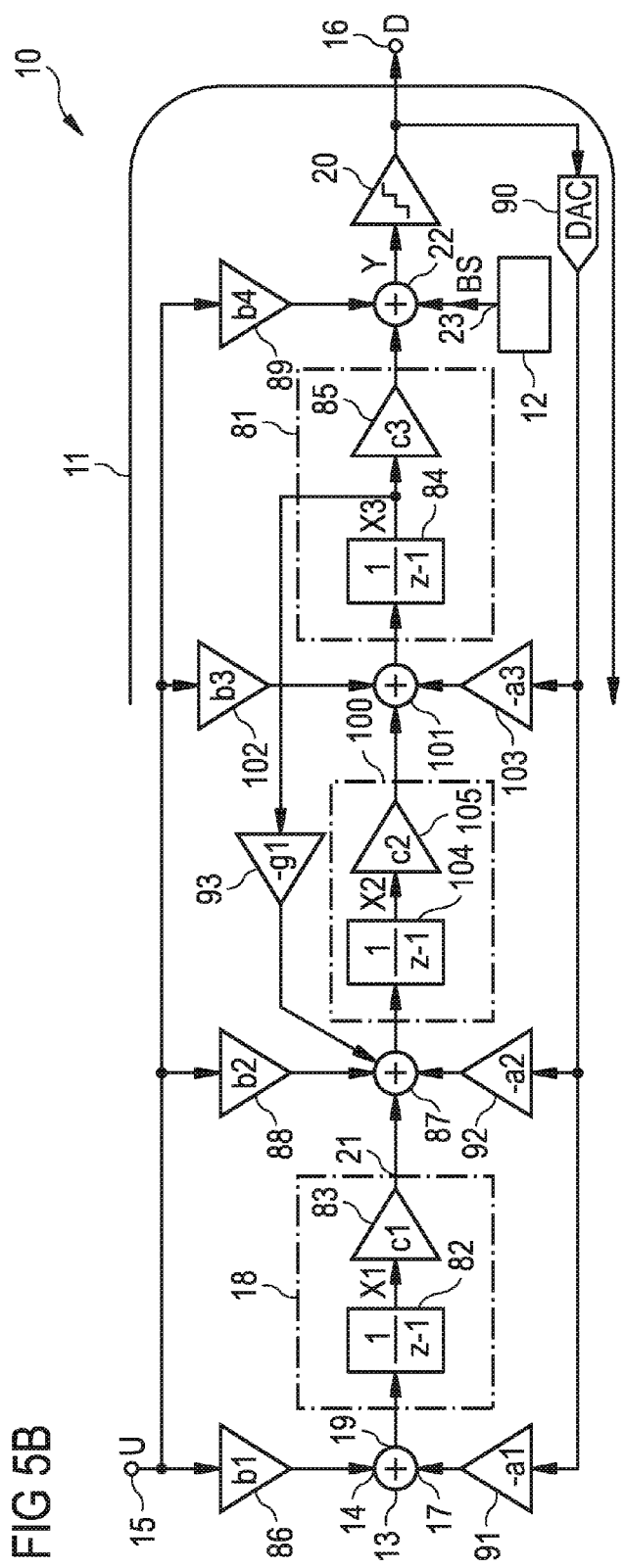

FIG. 5B shows an exemplary embodiment of the delta-sigma modulator 10 which is a further development of the delta-sigma modulators shown in FIGS. 1A to 1C, 2 and 5A. The delta-sigma modulator 10 as shown in FIG. 5B is also realized as a chain of integrators with distributed feedback. Whereas in FIG. 5A, an even order delta-sigma modulator is shown, an odd order delta-sigma converter is illustrated in FIG. 5B. The delta-sigma modulator 10 comprises an additional loop filter 100 and an additional adder 101. An output of the further adder 87 is coupled via the additional loop filter 100 to an input of the additional adder 101. The modulator input 15 is coupled via an additional input filter 102 to a further input of the additional adder 101. The modulator output 16 is coupled via the digital-to-analog converter 90 and a third filter 103 to an additional input of the additional adder 101. The additional loop filter 100 comprises an additional delaying integrator 104 and an additional filter 105 that are connected in series. A node between the second delaying integrator 84 and the second filter 85 is coupled via the feedback filter 93 to an input of the further adder 87.

In an alternative embodiment, not shown, the generator signal BS can be added to another node of the delta-sigma modulator 10, for example, to the adder 13, the further adder 87 or the additional adder 101.

Figure 5C:
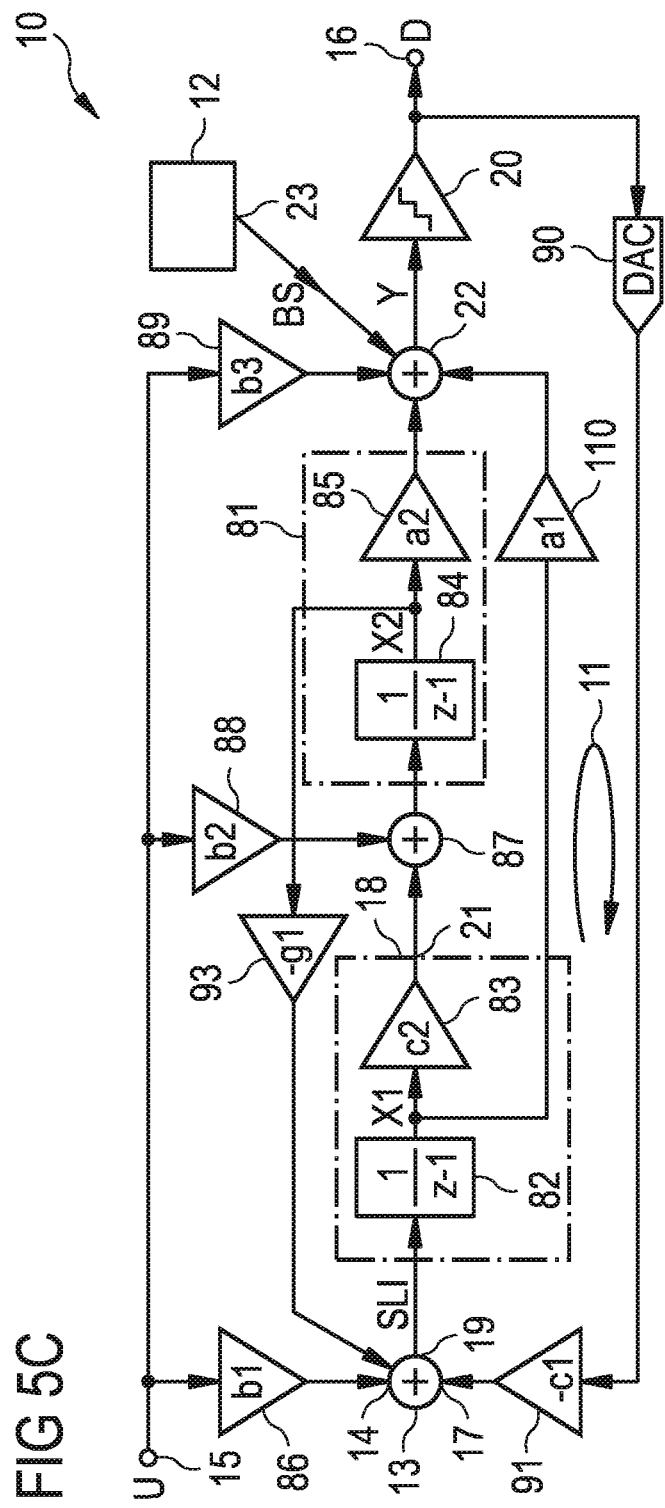
Figure 5D:
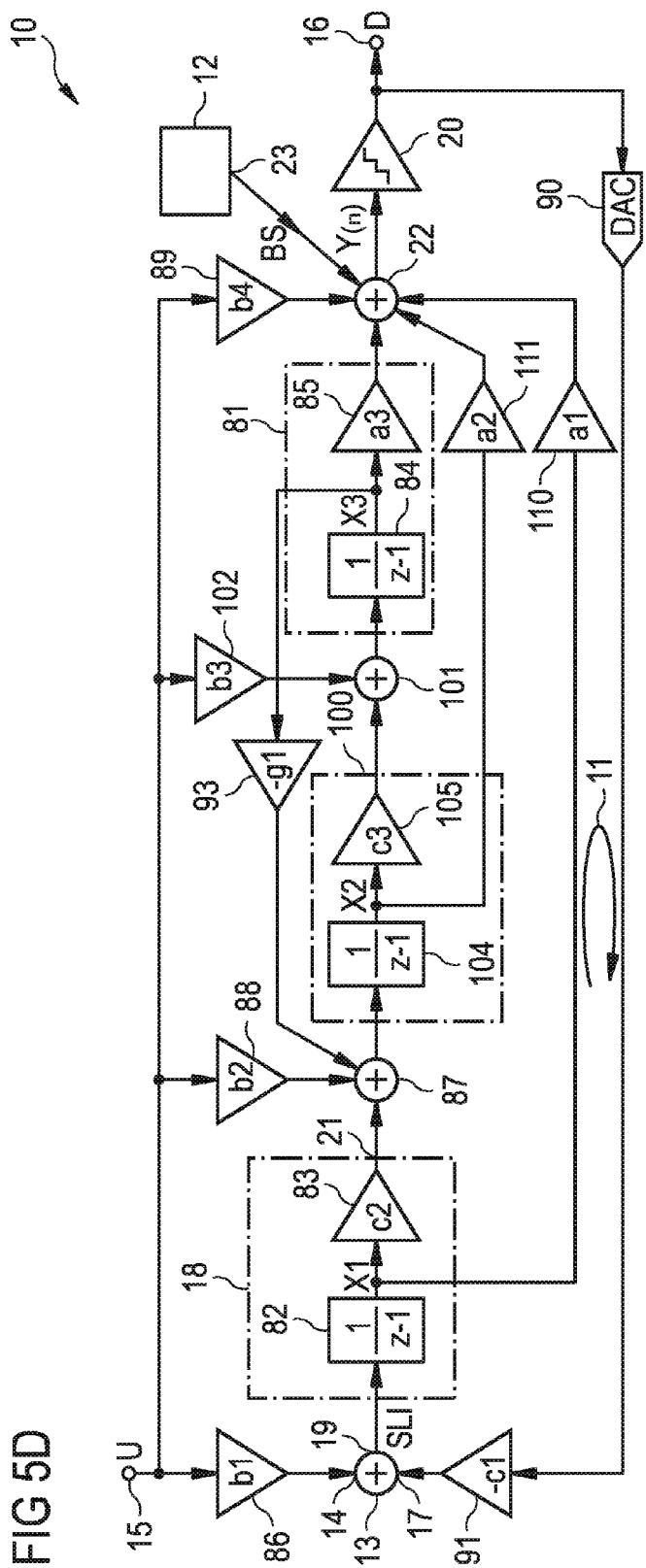

FIGS. 5C and 5D show exemplary embodiments of the delta-sigma modulator 10 which are further developments of the delta-sigma modulators shown in FIGS. 1A to 1C, 2, 5A and 5B. The delta-sigma modulators 10 elucidated in FIGS. 5C and 5D are realized as a chain of integrators with feed-forward summation, abbreviated to CIFF. Whereas in FIG. 5C a delta-sigma modulator 10 having an even order is shown, a delta-sigma modulator 10 with an odd order is illustrated in FIG. 5D. The delta-sigma modulator 10 of FIG. 5C has the second order, whereas the delta-sigma modulator 10 of FIG. 5D is of the third order.

The delta-sigma modulator 10 of FIG. 5C comprises the loop filter 18 and the further loop filter 81. The loop filter 18 is coupled between the adder output 19 and the input of the further adder 87. The output of the further adder 87 is coupled via the further loop filter 81 to the input of the code adder 22, corresponding to the circuit structure shown in FIG. 5A. The modulator input 15 is coupled via the first, the second and the third input filter 86, 88, 89 to inputs of the adder 13, the further adder 87 and the code adder 22. The modulator output 16 is coupled via the digital-to-analog converter 90 and the first feedback filter 91 to the further input of the adder 13. The modulator output 16 is not coupled to the further adder 87, contrary to FIG. 5A.

A node between the second delaying integrator 84 and the second filter 85 is coupled via the feedback filter 93 to the input of the adder 13. Moreover, a node between the delaying integrator 82 and the first filter 83 is coupled via a further filter 110 to a further input of the code adder 22. The code generator 12 is coupled to the input of the code adder 22. The code adder 22 is coupled via the quantizer 20 to the modulator output 16.

In an alternative embodiment, not shown, the code generator 12 is coupled to another node of the delta-sigma modulator 10 such as, for example, to an input of the adder 13 or the further adder 87.

Additionally to the delta-sigma modulator 10 as shown in FIG. 5C, the delta-sigma modulator 10 as illustrated in FIG. 5D comprises the additional loop filter 100, the additional adder 101 and the additional input filter 102. The additional loop filter 100 and the additional adder 101 are connected in series and couple the further adder 87 the further loop filter 81. The modulator input 15 is coupled to the additional adder 101 via the additional input filter 102. A node between the additional delaying integrator 104 and the additional filter 105 is coupled via an additional forward filter 111 to a further input of the code adder 22. A node between the second delaying integrator 84 and the second filter 85 is coupled via the feedback filter 93 to an input of the further adder 87.

The filters 83, 85, 86, 88, 89, 91, 92, 93, 102, 103, 105, 110, 111 of the delta-sigma modulator 10 shown in FIGS. 5A to 5D may be implemented as passive or active filters. In case of a negative filter coefficient such as −a1, −a2, −a3 and −c1, the filters may be implemented as active filters using an amplifier for inverting a signal provided to the filter. The passive filters may be designed as resistive voltage dividers. The adders 13, 22, 87, 101 may be realized as subtracting circuits. Thus, a filter with a negative filter coefficient and an adder can be replaced by a filter with a positive filter coefficient and a subtracting circuit.

In an alternative embodiment, not shown, the code generator 12 is coupled to another node of the delta-sigma modulator 10 instead of the code adder 22.

Figure 6A:
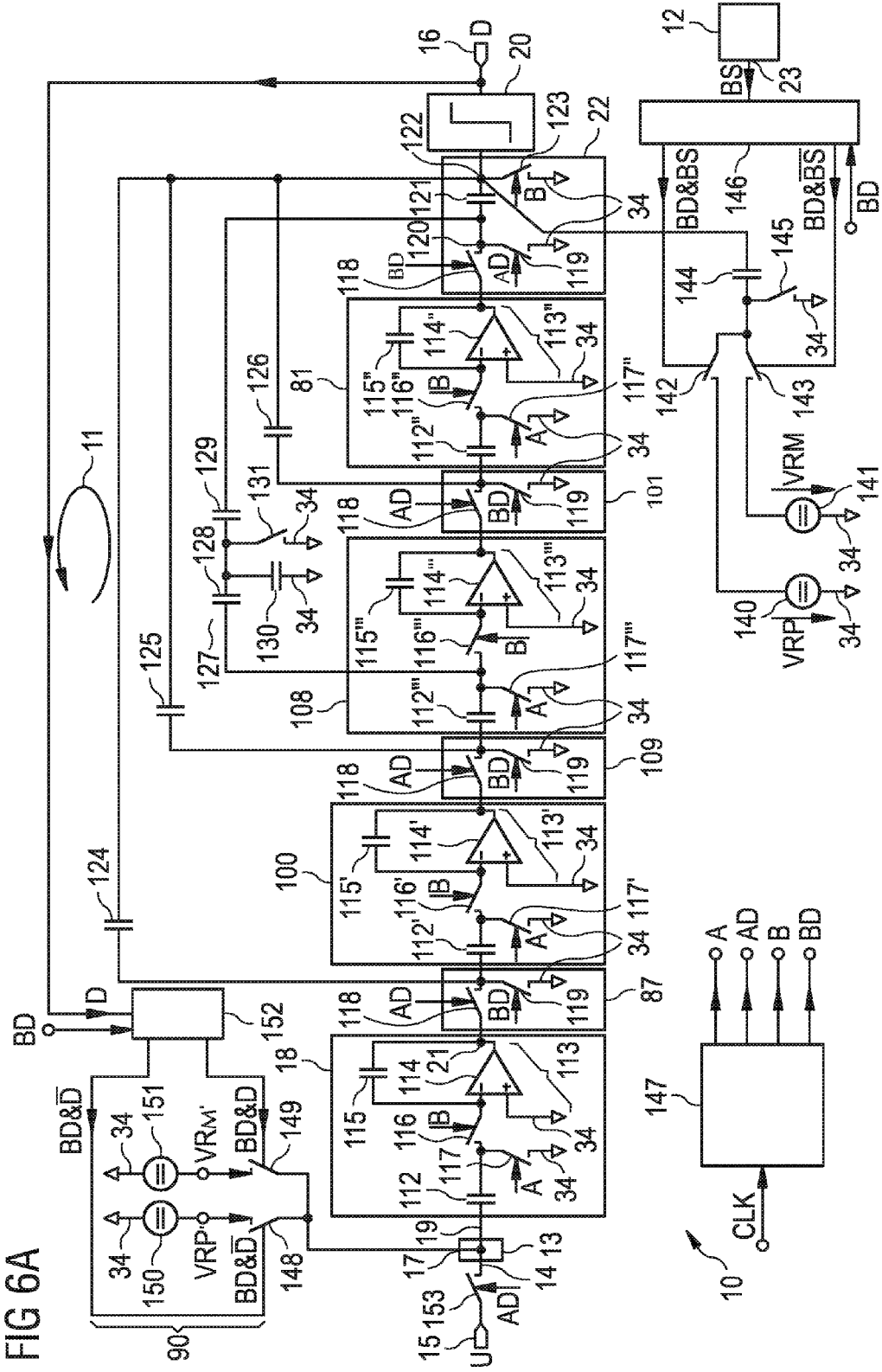

FIG. 6A shows an exemplary embodiment of the delta-sigma modulator 10 which is a further development of one of the delta-sigma modulators described above. The delta-sigma modulator 10 is of an even order, namely of a fourth order. The delta-sigma modulator 10 has a feed forward structure. The delta-sigma modulator 10 is realized as a chain of integrators with feed forward summation, similarly to FIGS. 5C and 5D. The delta-sigma modulator 10 is implemented by a switched capacitor circuit.

The delta-sigma modulator 10 comprises the loop filter 18, the further loop filter 81, the additional loop filter 100 and a fourth loop filter 108 which are connected in series between the adder 13 and the code adder 22. The code adder 22 is coupled via the quantizer 20 to the modulator output 16. The quantizer 20 can be implemented as 1-bit quantizer. The quantizer 20 may be realized as comparator. The additional loop filter 100 is coupled to the fourth loop filter 108 via a fourth adder 109. The fourth loop filter 108 is coupled via the additional adder 101 to the further loop filter 81.

Each of the loop filters 18, 81, 100, 108 comprises an input capacitor 112 and an integrator 113. The integrator 113 is implemented by an amplifier 114 and an integrating capacitor 115 that is arranged between an output of the amplifier 114 and an inverting input of the amplifier 114. The output of the amplifier 114 is connected to the loop filter output. A non-inverting input of the amplifier 114 is connected to the reference potential terminal 34. An input of the loop filter is connected to a first electrode of the input capacitor 112. A charging switch 116 connects a second electrode of the input capacitor 112 to the inverting input of the amplifier 114. A node between the input capacitor 112 and the charging switch 116 is connected via a reference switch 117 to the reference potential terminal 34.

Each of the adders 22, 87, 101, 109 comprises an input switch 118 that connects the output of the upstream loop filter to an input of the downstream loop filter. A ground switch 119 connects the input of the downstream loop filter to the reference potential terminal 34. In case of the code adder 22, the input switch 118 connects the output of the further loop filter 81 to an input node 120. The input node 120 is connected via the ground switch 119 to the reference potential terminal 34. An adder capacitor 121 couples the input node 120 of the code adder 22 to an output node 122 of the code adder 22. The output node 122 is connected to the input of the quantizer 20. The output node 122 is coupled via an output ground switch 123 to the reference potential terminal 34.

Several nodes of the loop filters 18, 81, 100, 108 are coupled via capacitors 124, 125, 126, 127 to the code adder 22. Thus, a first capacitor 124 is arranged between the input of the additional loop filter 100 and the output node 122 of the code adder 22. Furthermore, a second capacitor 125 couples the input of the fourth loop filter 108 to the output node 122 of the code adder 22. Further on, a third capacitor 126 is located between the input of the further loop filter 81 and the output node 122 of the code adder 22. In addition, a capacitor arrangement 127 is arranged between a node of the additional loop filter 100 and the input node 120 of the code adder 22. The capacitor arrangement 127 comprises a first to a third capacitor element 128 to 130, whereas a series circuit of the first and the second capacitor element 128, 129 couples the node in the additional loop filter 100 to the input node 120. A node between the first and the second capacitor element 128, 129 is connected via the third capacitor element 130 to the reference potential terminal 34. The node is connected by an additional ground switch 131 to the reference potential terminal 34.

The code generator 12 is connected to the output node 122 of the code adder 22. The code generator 12 comprises a first and a second voltage source 140, 141 that are coupled to the code adder 22 by a switch arrangement. The switch arrangement comprise a first and a second generator switch 142, 143. The first generator switch 142 and a generator output capacitor 144 are connected in series and are arranged between the first voltage source 140 and the code adder 22. The second voltage source 141 is coupled via the second generator switch 143 and the generator output capacitor 144 to the code adder 22. The first voltage source 140 provides a positive reference voltage VRP, whereas the second voltage source 141 generates a negative reference voltage VRM. A third generator switch 145 couples a node between the switch arrangement and the generator output capacitor 144 to the reference potential terminal 34. A generator driver logic 146 is connected on its input side to the code generator 12 and to a clock circuit 147 and on its output side to the control terminals of the first to the third generator switch 142, 143, 145.

The modulator output 16 is coupled via the digital-to-analog converter 90 to the adder 13. The digital-to-analog converter 90 comprises a first and a second converter switch 148, 149 and a first and a second reference source 150, 151. A node of the adder 13 is connected via the first converter switch 148 to the first reference source 150 and via the second converter switch 149 to the second reference source 151. A converter logic 152 of the digital-to-analog converter 90 is connected on its input side to the modulator output 16 and to the clock circuit 147 and on its output side to the control terminals of the first and the second converter switch 148, 149.

A modulator input switch 153 is arranged between the modulator input 15 and the adder 13. The delta-sigma modulator 10 is designed for an analog-to-digital converter.

FIG. 6B shows an exemplary embodiment of timing signals of the delta-sigma modulator 10 as shown in FIG. 6A. The timing of the switches is achieved by the clock circuit 147. The clock circuit 147 is triggered by the clock signal CLK. The clock circuit 147 generates signals for a first phase A and a second phase B. Moreover, the clock circuit 147 generates signals for a delayed first phase AD that is delayed in respect to the first phase A and a delayed second phase BD that is delayed in respect to the second phase B. The second phase B follows the first phase A. The signals for the four phases A, AD, B, BD are shown in FIG. 6B.

Since the delta-sigma modulator 10 is implemented as a switched capacitor circuit, some of the switches are in a conducting state in the first phase A, whereas other switches are in a conducting state in the second phase B. In addition, some of the switches are in a conducting state in the delayed first phase AD and other in the delayed second phase BD. In FIG. 6A, the signals A, AD, B, BD received by the different switches are indicated.

In an example, the code generator 12 may generate the generator signal BS with the extended Barker code [1 −1 −1 −1]. Thus, a negated generator signal $\overline{BS}$ is achieved by negation of the generator signal BS. The negated generator signal $\overline{BS}$ has the sequence [−1 1 1 1]. In FIG. 6B, the logical AND combination BD&BS of the delayed second phase BD and the generator signal BS and the logical AND combination BD&$\overline{BS}$ of the delayed second phase BD and the negated generator signal $\overline{BS}$ are also shown. These signals BD&BS, BD&$\overline{BS}$ are provided to the first and the second generator switch 142, 143.

The first generator switch 142 is in a conducting state in the second delayed phase BD and when the generator signal BS has the value 1. In all other cases, the first generator switch 142 is in a non-conducting state. Consequently, the second generator switch 143 is in a conducting state in the second delayed phase BD when the generator signal BS has the value −1. In all other cases, the second generator switch 143 is in a non-conducting state. Thus, in the first case the positive reference voltage VRP and in the second case the negative reference voltage VRM is provided to the code adder 22 as a function of the generator signal BS. The positive reference voltage VRP and the negative reference voltage VRM are selectively provided to the modulator loop 11 depending on the generator signal BS.

The first reference source 150 provides a positive reference source voltage VRP' and the second reference source 151 provides a negative reference source voltage VRM'. The first converter switch 148 is closed in the second delayed phase BD, when the output signal D has the logical value 0. Consequently, the second converter switch 149 is closed in the second delayed phase BD, when the output signal D has the logical value 1. Thus, in the first case the positive reference source voltage VRP' and in the second case the negative reference source voltage VRM' is provided to the code adder 22 as a function of the output signal D. Thus, the delta-sigma modulator 10 comprises a single-bit quantizer 20 and a single-bit digital-to-analog converter 90.

In an alternative embodiment, not shown, the delta-sigma modulator 10 comprises the comparator 30 as shown in FIGS. 1B and 1C. When a signal at the first comparator input 32 is higher than the predetermined value UP, than the first and the second generator switch 142, 143 are in a non-conducting state and neither the positive reference voltage VRP nor the negative reference voltage VRM are provided to the modulator loop 11. When the signal at the first comparator input 32 is equal or less than the predetermined value UP, the positive reference voltage VRP and the negative reference voltage VRM are selectively provided to the modulator loop 11 depending on the generator signal BS.

In an alternative, not shown embodiment, the first and the second voltage source 140, 141 are omitted and the first and the second reference source 150, 151 are connected to the code generator 12 for providing the positive and the negative voltage reference VRP, VRM.

The invention claimed is:
1. A delta-sigma modulator, comprising:
a modulator loop comprising a loop filter; and
a code generator that is configured to generate a generator signal that is realized as an extended Barker code, wherein the code generator comprises a generator output,
wherein the modulator loop comprises
a modulator input for receiving an input signal,
a modulator output for providing an output signal of the delta-sigma modulator,
an adder with a first adder input coupled to the modulator input, a second adder input coupled to the modulator output and an adder output coupled to an input of the loop-filter, and
a quantizer with an input coupled to a loop filter output of the loop-filter and an output coupled to the modulator output, wherein a code adder of the modulator loop comprises
a first input that is coupled to the loop filter output,
a second input that is coupled to the generator output and an output that is coupled to the input of the quantizer,
or the loop filter comprises more than one stage and comprises a further input that is coupled to the generator output and to a node between two stages of the loop filter,
wherein the extended Barker code comprises a code out of
a Barker code set comprising the code [1 −1], the code [1 1], the code [1 1 −1], the code [1 −1 1 1], the code [1 −1 −1 −1], the code [1 1 1 −1 1], the code [1 1 1 −1 −1 1 −1], the code [1 1 1 −1 −1 −1 1 −1 −1 1 −1] and the code [1 1 1 1 1 −1 −1 1 1 −1 1 −1 1], or
a reversed code, a negated code or a reversed and negated code of a code of the Barker code set, or
a code achieved by adding a bit [1] or [−1] to one of the codes comprised by the Barker code set or to the reversed code, the negated code or the reversed and negated code of a code of the Barker code set or
a compound Barker code realized by a combination of said codes.

2. The delta-sigma modulator according to claim 1, wherein the code generator comprises a counter.

3. The delta-sigma modulator according to claim 2, wherein the counter comprises at least one memory unit and a logic circuit with an output that is coupled to the generator output.

4. A delta-sigma modulator, comprising:
a modulator loop comprising a loop filter; and
a code generator that is configured to generate a generator signal that is realized as an extended Barker code and wherein the code generator comprises a generator output,
wherein the modulator loop comprises
a modulator input for receiving an input signal,
a modulator output for providing an output signal of the delta-sigma modulator,
an adder with a first adder input coupled to the modulator input, a second adder input coupled to the modulator output and an adder output coupled to an input of the loop-filter, and
a quantizer with an input coupled to a loop filter output of the loop-filter and an output coupled to the modulator output,
wherein a code adder of the modulator loop comprises
a first input that is coupled to the loop filter output,
a second input that is coupled to the generator output and an output that is coupled to the input of the quantizer,
or the loop filter comprises more than one stage and comprises a further input that is coupled to the generator output and to a node between two stages of the loop filter,
wherein the generator signal is
a constant signal when the input signal and/or the output signal is higher than a predetermined value, and
the extended Barker code when the input signal and/or the output signal is less or equal than the predetermined value.

5. The delta-sigma modulator according to claim 1, wherein the delta-sigma modulator comprises a comparator having
a first comparator input coupled to the modulator input or to the modulator output,
a second comparator input to which a predetermined value is provided and
a comparator output coupled to an enable input of the code generator.

6. An analog-to-digital converter, comprising the delta-sigma modulator according to claim 1, wherein the input signal is an analog signal and the output signal is a digital signal.

7. A microphone arrangement, comprising:
a first microphone that comprises a first transducer and a first delta-sigma modulator; and
a second microphone that comprises a second transducer and a second delta-sigma modulator, wherein the first and the second delta-sigma modulators are realized according to claim 1 and the extended Barker code of the first delta-sigma modulator is shifted in phase with respect to the extended Barker code of the second delta-sigma modulator.

8. A method for signal conversion, comprising:
performing a delta-sigma modulation by a modulator loop of a delta-sigma modulator, wherein the modulator loop comprises a loop filter;
generating a generator signal that is an extended Barker code by a code generator; and
providing the generator signal to the modulator loop,
wherein the loop filter comprises more than one stage and the generator signal is provided to a further input of the loop-filter that is coupled to a node between two stages of the loop filter
or the generator signal is provided to a second input of a code adder of the modulator loop, wherein a first input of the code adder is coupled to a loop-filter output of the loop-filter,
wherein the extended Barker code comprises a code out of
a Barker code set comprising the code [1 −1], the code [1 1], the code [1 1 −1], the code [1 −1 1 1], the code [1 −1 −1 −1], the code [1 1 1 −1 1], the code [1 1 1 −1 −1 1 −1], the code [1 1 1 −1 −1 −1 1 −1 −1 1 −1], the code [1 1 1 1 1 −1 −1 1 1 −1 1 −1 1], or
a reversed code, a negated code or a reversed and negated code of a code of the Barker code set, or
a code achieved by adding an bit [1] or [−1] to one of the codes comprised by the Barker code set or to the reversed code, the negated code or the reversed and negated code of a code of the Barker code set or
a compound Barker code realized by a combination of said codes.

9. A microphone arrangement, comprising a first and a second microphone, wherein the first microphone comprises a first transducer and a first read-out circuit comprising a first delta-sigma modulator such that the first transducer is coupled via the first read-out circuit to a first data output of the first microphone and
wherein the second microphone comprises a second transducer and a second read-out circuit comprising a second delta-sigma modulator such that the second transducer is coupled via the second read-out circuit to a second data output of the second microphone,
wherein the first and the second delta-sigma modulator each comprises:
a modulator loop comprising a loop filter, and
a code generator that is configured to generate a generator signal that is realized as an extended Barker code,
wherein the code generator comprises a generator output that is coupled to the loop filter, and wherein the extended Barker code of the first delta-sigma modulator is shifted in phase with respect to the extended Barker code of the second delta-sigma modulator.

10. A delta-sigma modulator, comprising:
a modulator loop comprising a loop filter; and
a code generator that is configured to generate a generator signal that is realized as an extended Barker code and wherein the code generator comprises a generator output that is coupled to the loop filter,
wherein the extended Barker code comprises a code out of
a Barker code set comprising the code [1 −1], the code [1 1], the code [1 1 −1], the code [1 −1 1 1], the code [1 −1 −1 −1], the code [1 1 1 −1 1], the code [1 1 1 −1 −1 1 −1], the code [1 1 1 −1 −1 −1 1 −1 −1 1 −1] and the code [1 1 1 1 1 −1 −1 1 1 −1 1 −1 1], or
a reversed code, a negated code or a reversed and negated code of a code of the Barker code set, or
a code achieved by adding a bit [1] or [−1] to one of the codes comprised by the Barker code set or to the reversed code, the negated code or the reversed and negated code of a code of the Barker code set or
a compound Barker code realized by a combination of said codes.

* * * * *